United States Patent
Blodget et al.

(10) Patent No.: US 6,920,627 B2
(45) Date of Patent: *Jul. 19, 2005

(54) RECONFIGURATION OF A PROGRAMMABLE LOGIC DEVICE USING INTERNAL CONTROL

(75) Inventors: Brandon J. Blodget, Santa Clara, CA (US); Scott P. McMillan, Santa Clara, CA (US); Philip B. James-Roxby, Longmont, CO (US); Prasanna Sundararajan, Los Gatos, CA (US); Eric R. Keller, Boulder, CO (US); Derek R. Curd, Woodside, CA (US); Punit S. Kalra, Superior, CO (US); Richard J. LeBlanc, Longmont, CO (US); Vincent P. Eck, Loveland, CO (US)

(73) Assignee: XILINX, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/377,857

(22) Filed: Feb. 28, 2003

(65) Prior Publication Data

US 2004/0117755 A1 Jun. 17, 2004

Related U.S. Application Data

(63) Continuation-in-part of application No. 10/319,051, filed on Dec. 13, 2002.

(51) Int. Cl.[7] .............................................. G06F 17/50
(52) U.S. Cl. .............................. 716/17; 716/16; 716/18
(58) Field of Search ...................... 716/1–8, 12, 16–18; 326/40, 41, 39

(56) References Cited

U.S. PATENT DOCUMENTS

| | | | |
|---|---|---|---|
| 6,078,735 A | | 6/2000 | Baxter |
| 6,096,091 A | | 8/2000 | Hartmann |
| 6,128,770 A | * | 10/2000 | Agrawal et al. ............... 716/17 |
| 6,204,687 B1 | | 3/2001 | Schultz et al. |
| 6,304,101 B1 | * | 10/2001 | Nishihara .................... 326/41 |
| 6,429,682 B1 | * | 8/2002 | Schultz et al. ................ 326/41 |
| 6,493,862 B1 | * | 12/2002 | Young et al. ................. 716/16 |
| 6,526,557 B1 | * | 2/2003 | Young et al. ................. 716/16 |
| 6,629,311 B1 | | 9/2003 | Turner et al. |

OTHER PUBLICATIONS

U.S. Appl. No. 09/419,386, filed Oct. 15, 1999, Fox et al.
Raphael David et al.; "DART: A Dynamically Reconfigurable Architecture Dealing with Future Mobile Telecommunications Constraints"; Parallel and Distributed Processing Symposium; Proceedings International, IPDPS 2002; Apr. 15–19, 2002; pp. 156–163.
Davin Lim and Mike Peattie; XAPP290 "Two Flows for Partial Reconfiguration: Module Based or Small Bit Manipulations"; available from Xilinx, Inc., 2100 Logic Drive, San Jose, California 95124; V1.0, May 17, 2002; pp1–23.

(Continued)

*Primary Examiner*—Matthew Smith
*Assistant Examiner*—Binh Tat
(74) *Attorney, Agent, or Firm*—Kim Kanzaki

(57) ABSTRACT

A method of partially reconfiguring an IC having programmable modules that includes the steps of reading a frame of configuration information from the configuration memory array; modifying at least part of the configuration information, thereby creating a modified frame of configuration information; and overwriting the existing frame of configuration information in the configuration memory array with the modified frame, thereby partially reconfiguring the IC.

15 Claims, 19 Drawing Sheets

OTHER PUBLICATIONS

Nick Camilleri; XAPP 153, Application Note, "Status and Control Semaphore Registers Using Partial Reconfiguration"; Jun. 7, 1999 (Version 1.0); available from Xilinx, Inc., 2100 Logic Drive, San Jose, California 95124; pp. 1–4.

Xilinx, Inc.; XAPP 151, Application Note: Virtex Series, "Virtex Series Configuration Architecture User Guide"; Sep. 27, 2000 (V1.5); available from Xilinx, Inc., 2100 Logic Drive, San Jose, California 95124; pp. 1–45.

Xilinx, Inc., XAPP 138, Application Note: Virtex Series, "Virtex FPGA Series Configuration and Readback"; Nov. 5, 2001 (v2.5); available from Xilinx, Inc., 2100 Logic Drive, San Jose, California 95124; pp. 1–39.

Xilinx, Inc.; Virtex–II Pro Platform FPGA Documentation; "Rocket I/O Transceiver User Guide"; Mar. 2002 Release; available from Xilinx, Inc., 2100 Logic Drive, San Jose, California 95124; pp. 1059–1150.

Xilinx, Inc.; Virtex–II Pro, Platform FPGA Handbook; Oct. 14, 2002 (v2.0); available from Xilinx, Inc., 2100 Logic Drive, San Jose, California 95124; pp. 1–589.

Xilinx, Inc.; Virtex–II Pro Platform FPGA Documentation; "Advance Product Specification"; Mar. 2002 Release; available from Xilinx, Inc., 2100 Logic Drive, San Jose, California 95124; pp. 1–342.

Xilinx, Inc.; Virtex–II Pro Platform FPGA Documentation; "PPC 405 User Manual,"; Mar. 2002 Release; available from Xilinx, Inc., 2100 Logic Drive, San Jose, Californina 95124; pp. 343–870.

Xilinx, Inc.; Virtex–II Pro Platform FPGA Documentation; "PPC 405 Processor Block Manual"; Mar. 2002 Release; available from Xilinx, Inc., 2100 Logic Drive, San Jose, California 95124; pp. 871–1058.

* cited by examiner

| PORT_ID | WR | RB | DONE | CONFIG_DONE | START_ADDR | END_ADDR |

US 6,920,627 B2

RECONFIGURATION OF A PROGRAMMABLE LOGIC DEVICE USING INTERNAL CONTROL

FIELD OF THE INVENTION

The present invention relates to reconfiguration of an Integrated Circuit (IC) having programmable modules. More specifically, the present invention relates to the full or partial self-reconfiguration of the programmable modules.

BACKGROUND

Dynamic reconfiguration and self-reconfiguration are two of the more advanced forms of field programmable gate array (FPGA) reconfigurability. Dynamic reconfiguration involves the active FPGA being fully or partially reconfigured, while ensuring the correct operation of those active circuits that are not being changed. Self-reconfiguration extends the concept of dynamic reconfigurability. It assumes that specific circuits on the FPGA itself are used to control the reconfiguration of other parts of the FPGA. Both dynamic reconfiguration and self-reconfiguration rely on an external reconfiguration control interface to boot an FPGA when power is first applied or the device is reset.

FIG. 1 is a block diagram of a conventional FPGA 90, which includes input/output (I/O) blocks 102A (each labeled IO) located around the perimeter of the FPGA, multi-gigabit transceivers (MGT) 104A interspersed with the I/O blocks, configurable logic blocks 106A (each labeled CLB) arranged in an array, block random access memory 108A (each labeled BRAM) interspersed with the CLBs, configuration logic 112, configuration interface 114, on-chip processor 92 (labeled PowerPC®) and internal configuration access port (ICAP) 120. Although FIG. 1 shows a relatively small number of I/O blocks, CLBs and block RAMs for illustration purposes. It is understood that an FPGA typically includes many more of these elements. On-chip processor 92 is an IBM PowerPC® 405 processor. FPGA 90 can include more than one of these processors (typically up to four of these processors). FPGA 90 also includes other elements, such as a programmable interconnect structure and a configuration memory array, which are not illustrated in FIG. 1. FPGA 90 is described in more detail in "Virtex-II™ Pro, Platform FPGA Handbook", (Oct. 14, 2002) which includes "Virtex-II Pro™ Platform FPGA Documentation" (March 2002) "Advance Product Specification," "Rocket I/O Transceiver User Guide", "PPC 405 User Manual" and "PPC 405 Processor Block Manual" available from Xilinx, Inc., 2100 Logic Drive, San Jose, Calif. 95124.

In general, FPGA 90 is configured in response to a set of configuration data values, which are loaded into a configuration memory array of FPGA 90 (not shown) from an external memory, e.g., a read-only memory (ROM), via configuration interface 114 and configuration logic 112. Configuration interface 114 can be, for example, a select map interface, a JTAG interface, or a master serial interface. The configuration memory array can be visualized as a rectangular array of bits. The bits are grouped into frames that are one-bit wide words that extend from the top of the array to the bottom. The configuration data values are loaded into the configuration memory array one frame at a time from the external memory via the configuration interface 114.

FIGS. 2-1 and 2-2 are simplified conceptual diagrams of the configuration memory array. The bits of the configuration memory array 100 (and 101) configure, for example, the CLBs 106B, BRAMs 108B, MGTs 104B, and I/Os 102B. In FIGS. 2-1 and 2-2 the labels are chosen so that the configuration memory array elements (with a B suffix) in FIGS. 2-1 and 2-2 correspond to their associated physical components (with an A suffix) in FIG. 1. A frame 122 is a column one bit wide extending from the top of the array 100 to the bottom. A frame is the smallest part of the configuration memory array that can be written to or read from.

The processor block is either a hard-core processor, e.g., processor block 110 of FIGS. 2-1 and processor 92 of FIG. 1, such as the PowerPC® of IBM Corp. of Armonk, N.Y., or a soft core processor having CLBs, e.g., processor block 109 of FIGS. 2-2, such as the MicroBlaze™ processor core of Xilinx Inc. of San Jose, Calif.

In order to provide self-reconfiguration for the FPGA, the internal configuration access port (ICAP) 120 was added. The ICAP 120 gives access by the FPGA's internal logic (e.g., CLB's 106A and BRAMs 108A) to the configuration memory array 100 (and 101). In other words, one part of the configured FPGA can reconfigure another part of the FPGA. Conventionally, this self-reconfiguration was done by loading pre-generated reconfiguration frames in the BRAM, and using customized logic, over-writing pre-targeted frames in the configuration memory array with these pre-generated reconfiguration frames.

FIG. 3 shows the ICAP module 120 of the prior art. There is an eight bit wide input bus 210 and an eight bit wide output bus 218. The input write signal 212 indicates when there is a read from or write to the ICAP module 120 (where, e.g., write=1 and read=0). Additional inputs include a chip enable signal 214 and a clock signal 216. The busy (done) output signal 220 indicates when data can be received by the ICAP module 120.

FIG. 4 is a simplified format of a data packet 310 sent to the input bus 210 of the ICAP module 120 of FIG. 3. The data packet 310, includes a command portion 312 having an operation (op) code 316, a register address 318, and a word count 320 for the data portion 314, and the data portion 314. The operation code 316 includes commands to the configuration logic 112 to, for example, read from or write to the configuration memory array 100. There are registers in the configuration logic 112, which are identified by register address 318. Further details can be found in Xilinx, Inc. application note, XAPP151, Sep. 27, 2000, titled "Virtex Series Configuration Architecture User Guide."

There are several disadvantages with using the above custom logic self-reconfiguration approach. First, for example, the approach lacks flexibility, as what is to be reconfigured must be predetermined, i.e., the frames pre-generated and the custom logic set. Second, any changes to the reconfiguration take a significant amount of time, as the modified reconfiguration must be pre-loaded. Third, pre-loading entire frames, when only parts of the frames need to be reconfigured is inefficient. And fourth, more complex dynamic reconfiguration scenarios, such as modifying selected resources, generating parameterized circuits on the fly, relocating partial bitstreams to other locations on the array are very difficult to implement in custom logic.

Accordingly, it would be desirable to have an improved scheme for implementing the self-reconfiguration of an FPGA, which overcomes the above-described deficiencies.

SUMMARY

The present invention relates to the self-reconfiguration of an IC, having a plurality of programmable modules, using on-chip processing to perform a read-modify-write of the configuration information stored in the configuration memory array.

Accordingly, an exemplary embodiment of the present invention provides a method of partially reconfiguring an IC having programmable modules, that includes the steps of (1) loading a base set of configuration information into a configuration memory array for the programmable modules, thereby configuring the IC; (2) reading a frame of configuration information from the configuration memory array; (3) modifying at least part of the configuration information, thereby creating a modified frame of configuration information; and (4) overwriting the existing frame of configuration information in the configuration memory array with the modified frame, thereby partially reconfiguring the IC. The steps of reading, modifying and writing are performed under the control of a processor located on the IC.

An embodiment of the present invention includes a method for reconfiguring an integrated circuit, having a plurality of programmable logic modules, a processor, a memory array having configuration information for the plurality of programmable logic modules, and a memory module. The method includes the steps of: first, reading a section of the configuration information from the memory array. Next, the section is stored in the memory module. The processor then modifies at least some of the section. And lastly, the modified section of the configuration information is written back to the memory array.

Another embodiment of the present invention includes a method for reconfiguring a programmable logic device, where the programmable logic device has a plurality of programmable components, a configuration memory array, a processor, and a plurality of block memory modules. The method includes the steps of: first, reading configuration data for a programmable component from the configuration memory array. Next, the configuration data is stored in a block memory. The processor then partially modifies the stored configuration data. And lastly, and the partially modified configuration data is written back to the configuration memory array.

A further embodiment of the present invention includes an integrated circuit having programmable logic components. The IC further includes: a first memory storing configuration information for the programmable logic components; an access port having access to the first memory; a processor connected by a first bus to a second memory; and a control module connected to the access port and the first bus, where the control module receives control information from the processor via the first bus, and the control information configures the control module to transfer part of the configuration information to the second memory from the first memory via the access port.

Another embodiment of the present invention includes a programmable logic device having: a processor, a memory, a configuration memory array for configuring the programmable logic device, an access port having access to the configuration memory array, and a control module for controlling the access port. The control module includes: an address module configured to determine one or more addresses in the memory for storing data from the configuration memory array, where the address module receives a start address from the processor; and a status register connected to the processor and having a flag indicating to the processor an end of a transfer cycle.

An aspect of the present invention includes a graphical user interface (GUI) for reconfiguring bits of a configuration memory array of a programmable logic device. The GUI includes: a window displaying at least part of the configuration memory array; a first region in the window having a first set of bits of the configuration memory array; a memory configured to store a copy of the first set, when a user selects a control to copy the first region; and a second region in the window having a second set of bits of the configuration memory array, said second set over-written by the copy of the first set in response to a command by the user.

Another aspect of the present invention includes an application programming interface having computer routines stored in a computer readable medium for controlling transfer of a frame between a configuration memory array and a random access memory (RAM) of a programmable logic device, where the computer routines are executed by an processor of the programmable logic device. The computer routines include: a first routine for reading the frame from the configuration memory array to the RAM; and a second routine for writing the frame from the RAM to the configuration memory array.

Yet another aspect of the present invention includes an integrated circuit having programmable logic components. The IC further includes: a configuration memory array for storing configuration information for the programmable logic components; an access port having access to the configuration memory array; a first processor connected by a first bus to a memory; a second processor connected by the first bus to the memory; a semaphore module having a semaphore, wherein only one processor of the first or second processor is granted the semaphore until a predetermined event occurs; and a control module connected to the access port and the first bus, where the control module receives control information from the one processor granted the semaphore, and where the control information configures the control module to transfer part of the configuration information to the memory from the configuration memory array via the access port.

The present invention will be more full understood in view of the following description and drawings.

BRIEF DESCRIPTION OF THE DRAWINGS

FIGS. 2-1 and 2-2 are simplified conceptual diagrams of the configuration memory array;

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

In accordance with the described embodiments of the present invention, an IC having programmable modules and one or more on-chip processors is configured to implement an efficient partial reconfiguration scheme. The reconfiguration is performed on one or more frames of the configuration memory array, which includes configuration information or data for the programmable modules, e.g., the CLBs, BRAMs, IOs and MGTs. The term "frame" used herein is any set of one or more bits of configuration information and is not limited to a one-bit vertical column.

Figure 1:
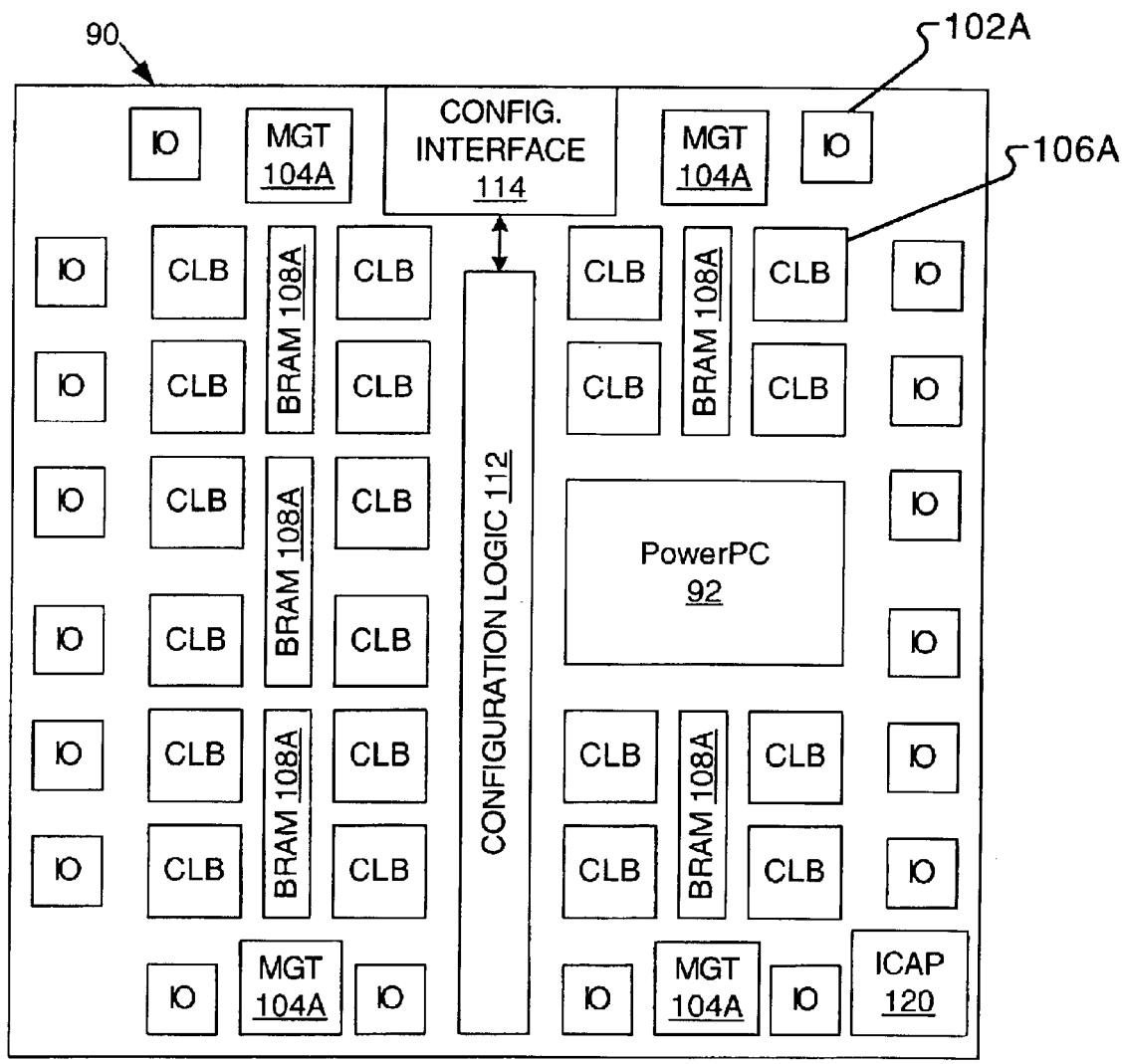
FIG. 1 is a block diagram of a conventional FPGA.
Figures 1, 2:
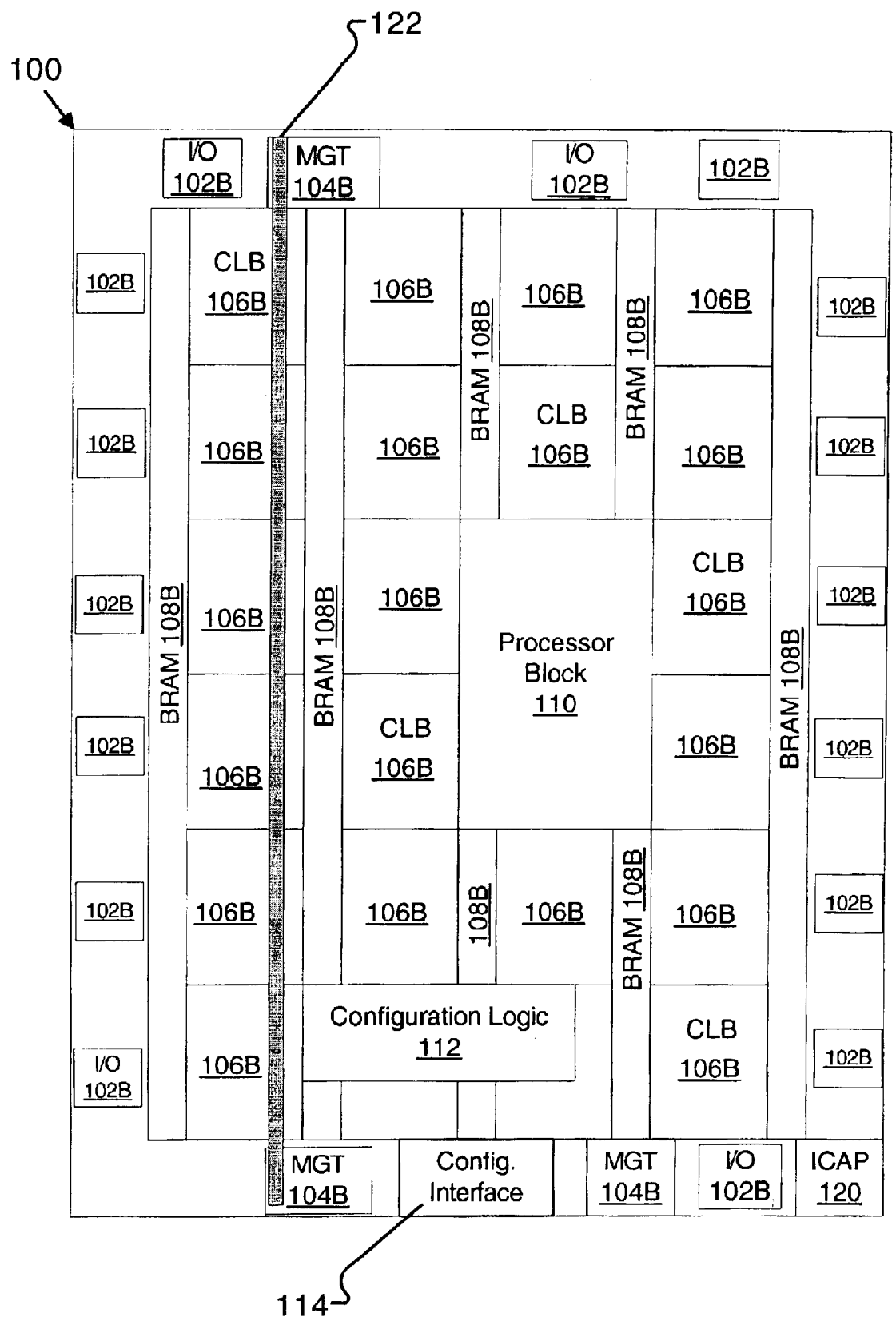
Figure 2:
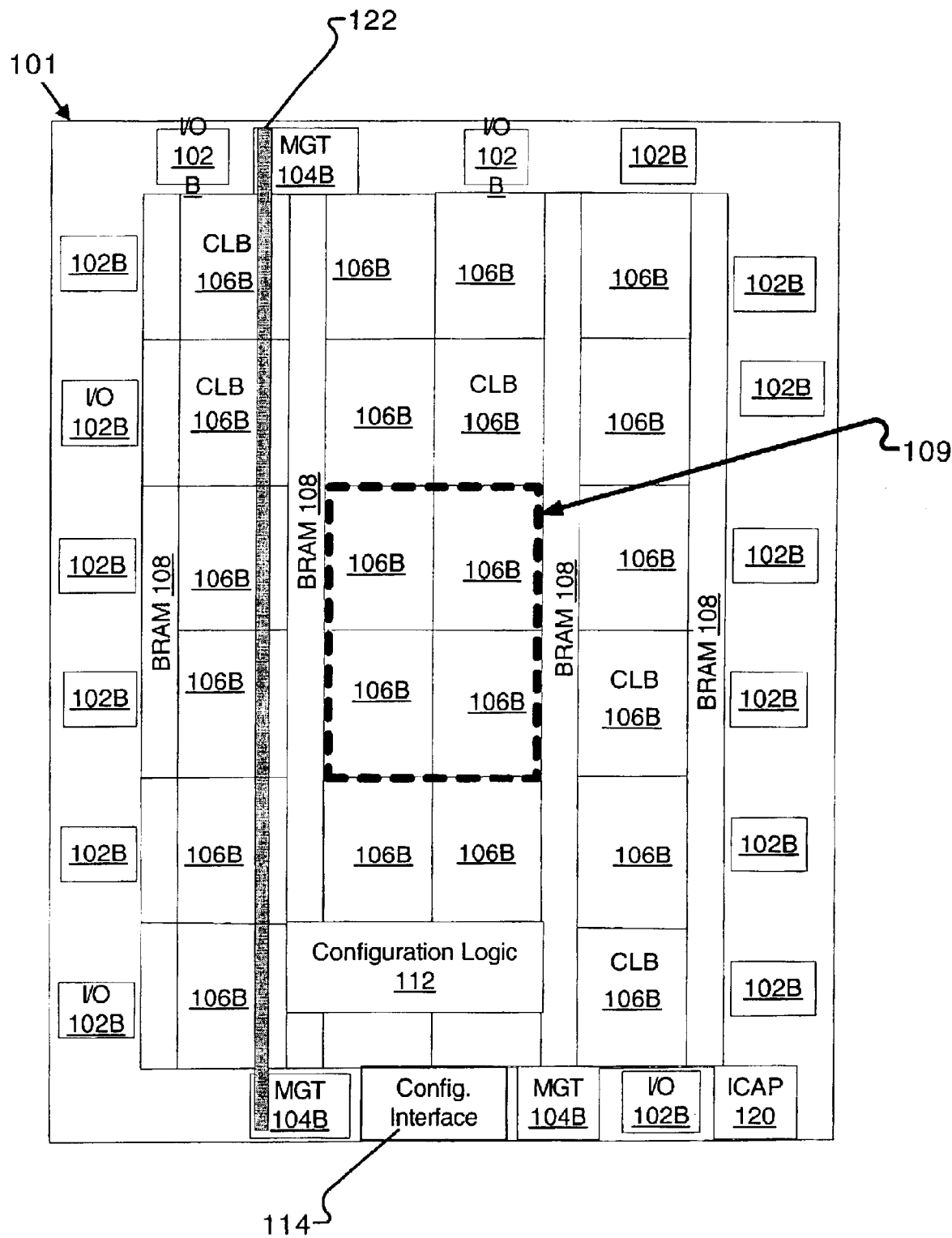
Figure 3:
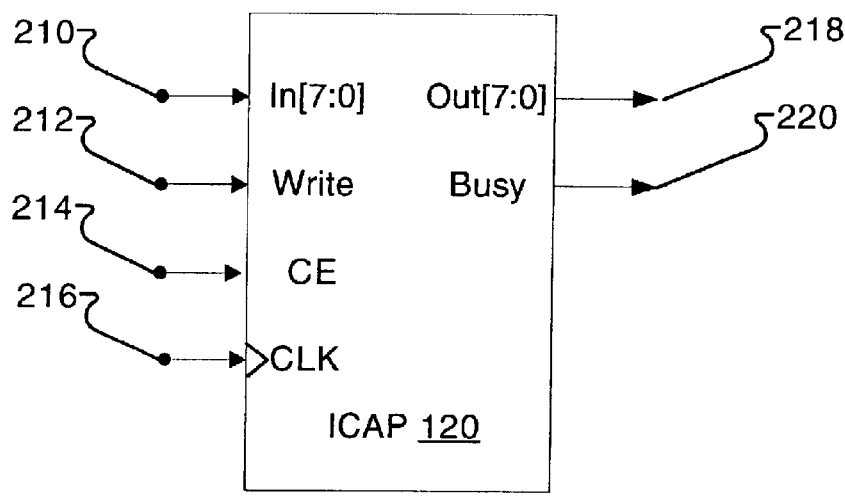
FIG. 3 shows the ICAP module 120 of the prior art.

Some of the modules used in some embodiments of the present invention are similar to or the same as the modules given in FIGS. 1, 2-1, 2-2, and 3 and are given the same labels in order to not obscure the invention.

Figure 5:
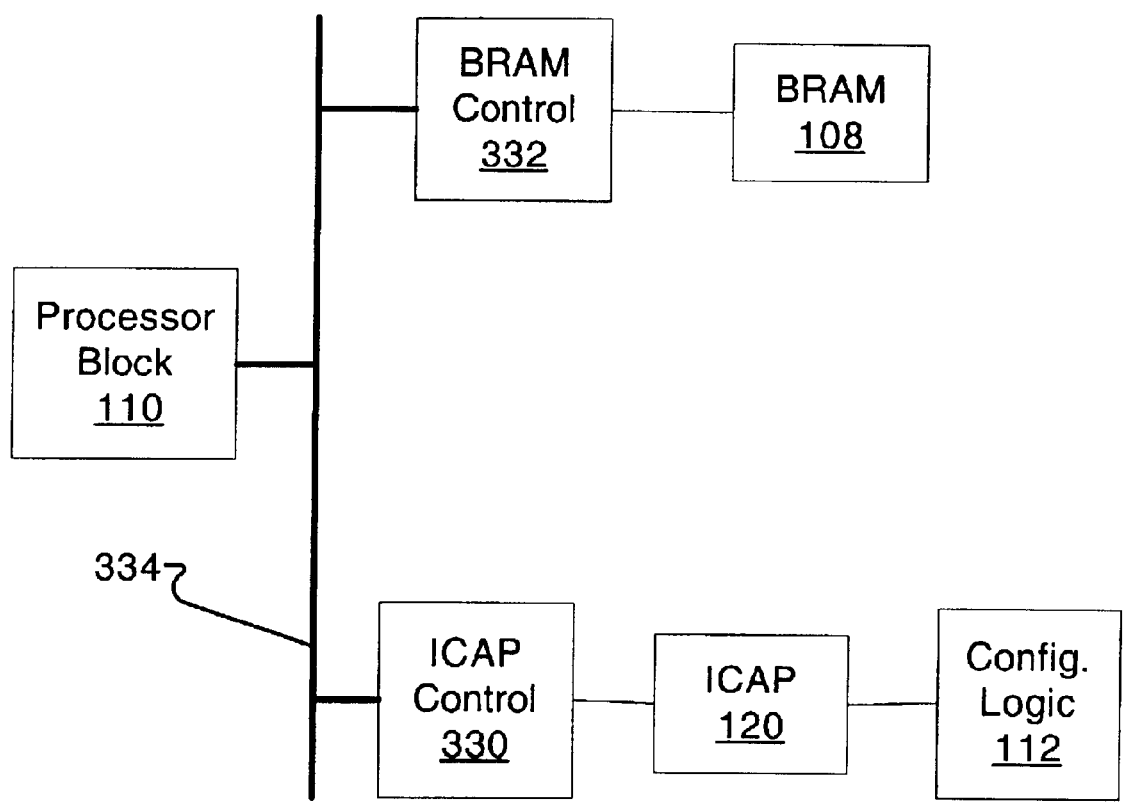
FIG. 5 is a simplified schematic of a system for self-reconfiguration of an IC of an embodiment of the present invention.

FIG. 5 is a simplified schematic of a system for self-reconfiguration of an IC of an embodiment of the present invention. The IC includes a processor block 110, a BRAM control module 332, a BRAM 108, an ICAP control module 330, and ICAP module 120, and a configuration logic module 112. The processor block 110 is coupled to the BRAM control module 332, which controls the BRAM 108. The processor block 110 is also coupled to the ICAP control module 330. The ICAP control module 330 supplies the data and control signals to and receives the data and busy signal from the ICAP 120 (see FIG. 3). Embodiments of the present invention show different implementations of the ICAP control module.

Figure 6:
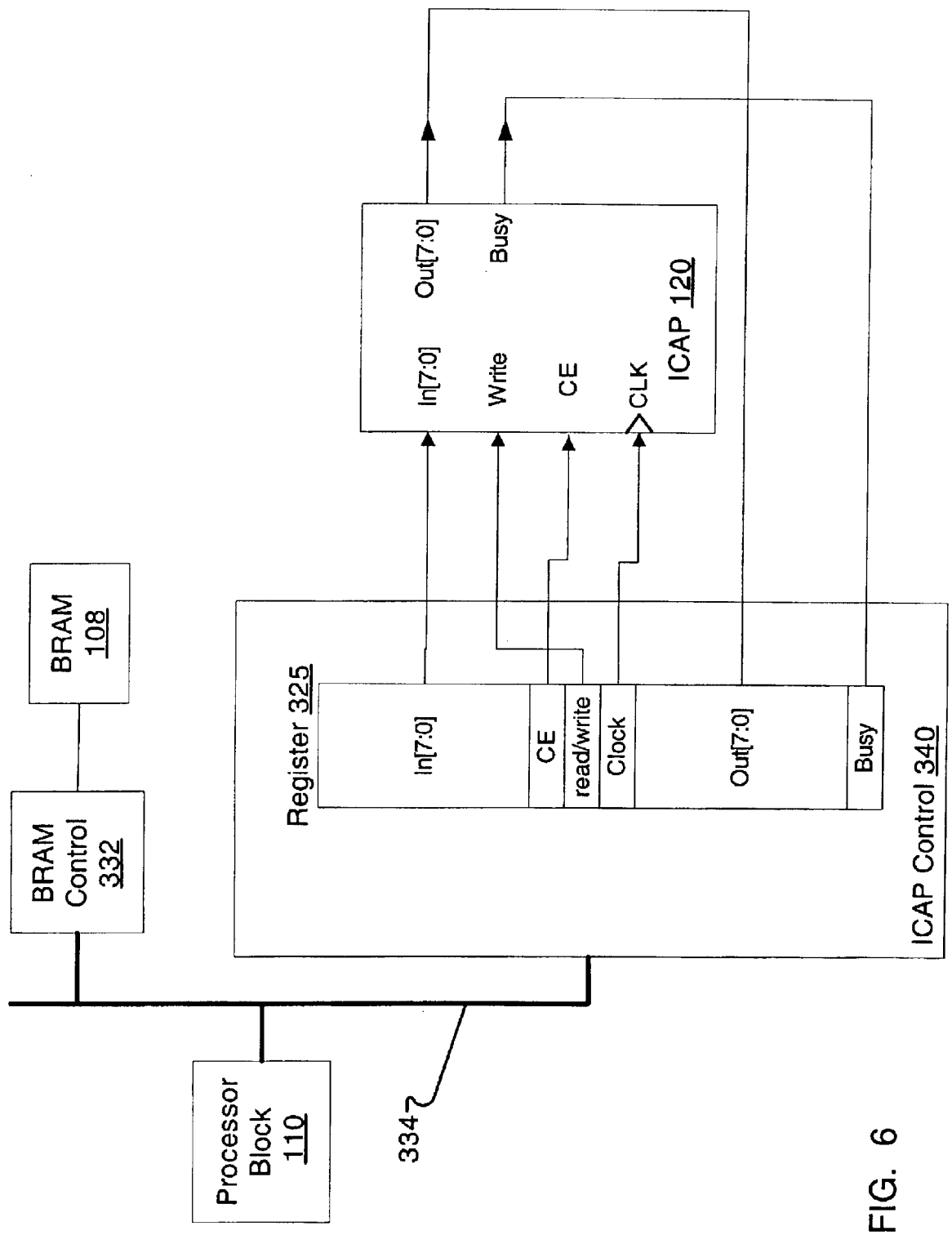
FIG. 6 shows an ICAP control register implementation of an ICAP control module of an aspect of the present invention.

FIG. 6 shows an ICAP control register implementation of an ICAP control module of an aspect of the present invention. The ICAP control module 340 has a 32-bit register 325 whose content maps one-to-one with the corresponding data and control signals of the ICAP 120. The processor block 110 reads from and writes to register 325 via bus 334. When the processor block 110 includes the MicroBlaze™ architecture configured using the CLBs 106A, one of the Micro-Blaze™ registers is register 325.

Figure 7:
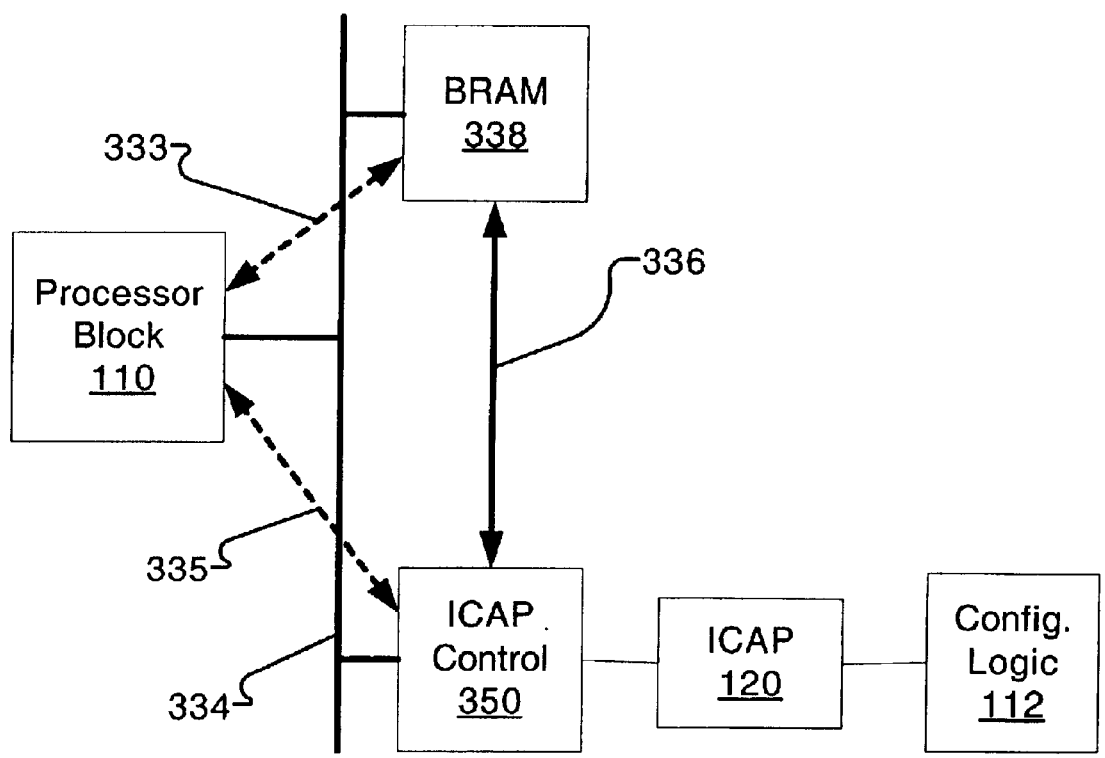
FIG. 7 is a simplified schematic of a system for self-reconfiguration of an IC of a preferred embodiment of the present invention.

FIG. 7 is a simplified schematic of a system for self-reconfiguration of an IC of a preferred embodiment of the present invention. Processor block 110 is connected to a memory module, such as BRAM 338 and ICAP control module 350 via bus 334. BRAM 338 includes one or more BRAMs 108A and includes the BRAM control. ICAP control module 350 is connected to ICAP 120. ICAP 120 is connected to the configuration memory array via the configuration logic 112. The configuration memory array includes configuration information or data for the programmable logic components of the IC such as the CLBs. Embodiments of the present invention of the ICAP control module 350 are given in FIG. 9 (module 352), FIG. 11 (module 380), and FIG. 16 (module 382). The ICAP control module 350 also has a separate dedicated bus 336 to BRAM 338 in order to facilitate data transfer so that the use of the system bus 334 can be reduced or avoided. There is, optionally, a dedicated connection between the processor block 110 and the BRAM 338 (dotted line 333 of FIG. 7) or a dedicated connection between the processor block 110 and the ICAP control 350 (dotted line 335 of FIG. 7) or both. In an alternative embodiment communications between processor block 110 and BRAM 338 and/or between processor block 110 ICAP control 350 occur directly over these direct links (333, 335) rather than system bus 334.

Figures 8, 9:
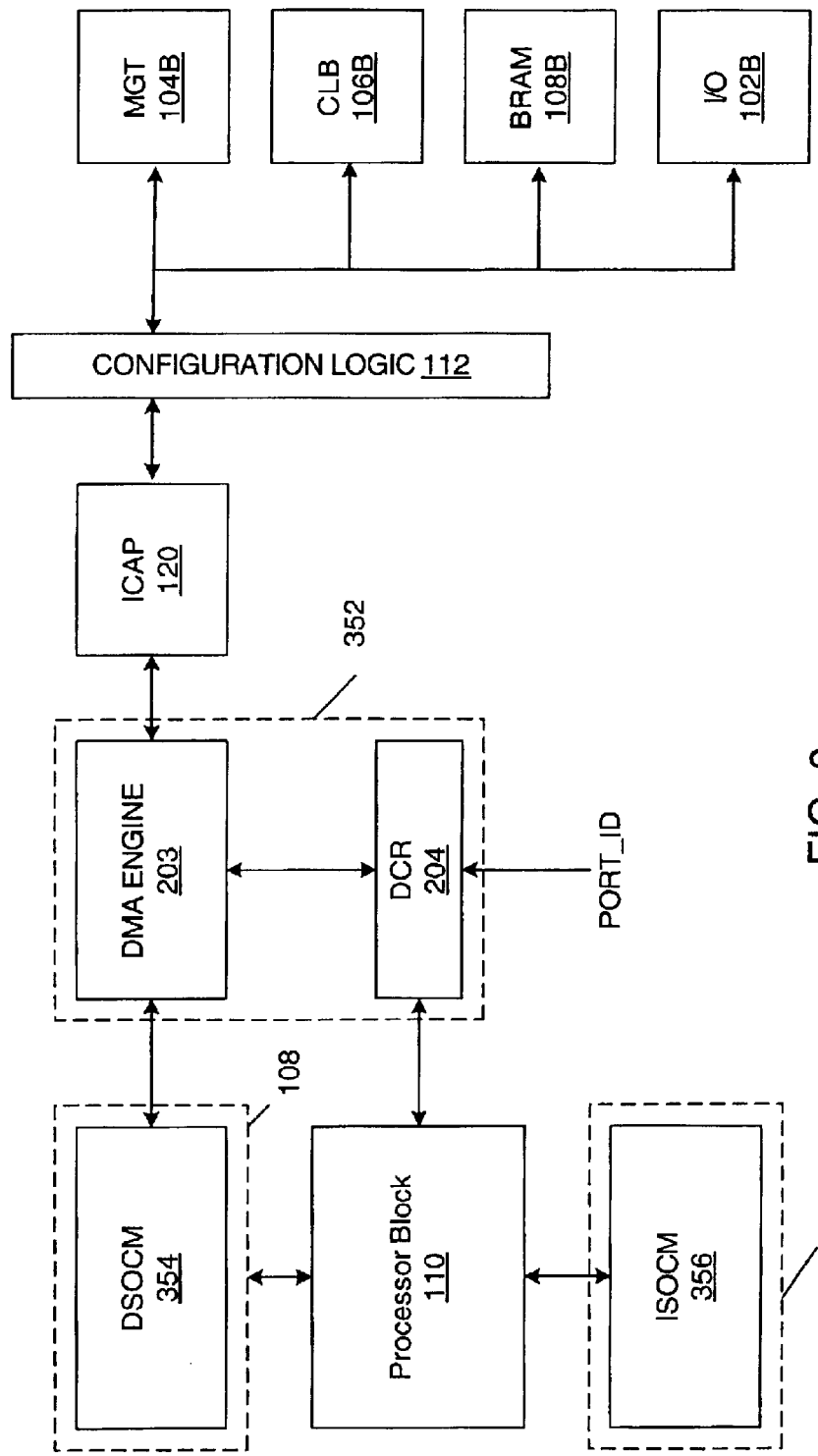
FIG. 8 is a block diagram of an architecture using the ICAP of an aspect of the present invention.
FIG. 9 is a block diagram of a device control register used in the ICAP control module of FIG. 8, in accordance with one aspect of the present invention.

FIG. 8 is a block diagram of an architecture using the ICAP of an aspect of the present invention. FIG. 8 illustrates a variation of FIG. 7, where the ICAP control module 352 is an example of ICAP control module 350 of FIG. 7, and there are two additional buses that provide dedicated connections between the processor block 110 and the BRAM 338 (dotted line 333 of FIG. 7) and between the processor block 110 and the ICAP control 350 (dotted line 335 of FIG. 7).

ICAP control module 352 includes a direct memory access (DMA) engine 203 and a device control register (DCR) 204. These elements 203–204 are formed by CLBs, which are configured in response to the base set of configuration data values. As described in more detail below, commands are issued to DMA engine 203 through device control register 204.

The ICAP control module 352 is connected to ICAP 120. Configuration logic 112 is coupled between ICAP 120 and the configuration memory cells, e.g., MGT 104B, CLB 106B, BRAM 108B, and I/O 102B, of the configuration memory array. The ports (FIG. 3) of ICAP 120 are accessible to the user logic of FPGA 90 via the general interconnection grid.

A data side on-chip memory (DSOCM) 354, which is formed by one or more BRAMs 108A, is an example of the BRAM 338 in FIG. 7. The DSOCM 354 has a direct connection to the ICAP control 350 (ICAP control 352 in FIG. 8) via bus 336 and is also connected to processor block 110 via bus 334. DSOCM 354 stores, for example, program data, configuration frame data, and bit stream commands for read and write operations.

An instruction side on-chip memory (ISOCM) 356 (not shown in FIG. 7) is also formed by one or more BRAMs 108A and is connected to processor block 110 via bus 334. ISOCM 356 stores, for example, instruction code necessary to operate processor block 110. In an alternative embodiment ISCOM 356 is merged into DSCOM 354, so that there is only a DSOCM having the contents of both the DSCOM 354 and ISCOM 356.

FIG. 9 is a block diagram of the contents of device control register 204. DCR 204 is a 32-bit register that stores a 4-bit port identification entry (PORT_ID), a 1-bit write enable entry (WR), a 1-bit read-back enable entry (RB), a 1-bit instruction done flag (DONE), a 1-bit reconfiguration done flag (CONFIG_DONE), an 11-bit start address (START_ADDR), an 11-bit end address (END_ADDR), and two unused bits (not shown).

Figure 10:
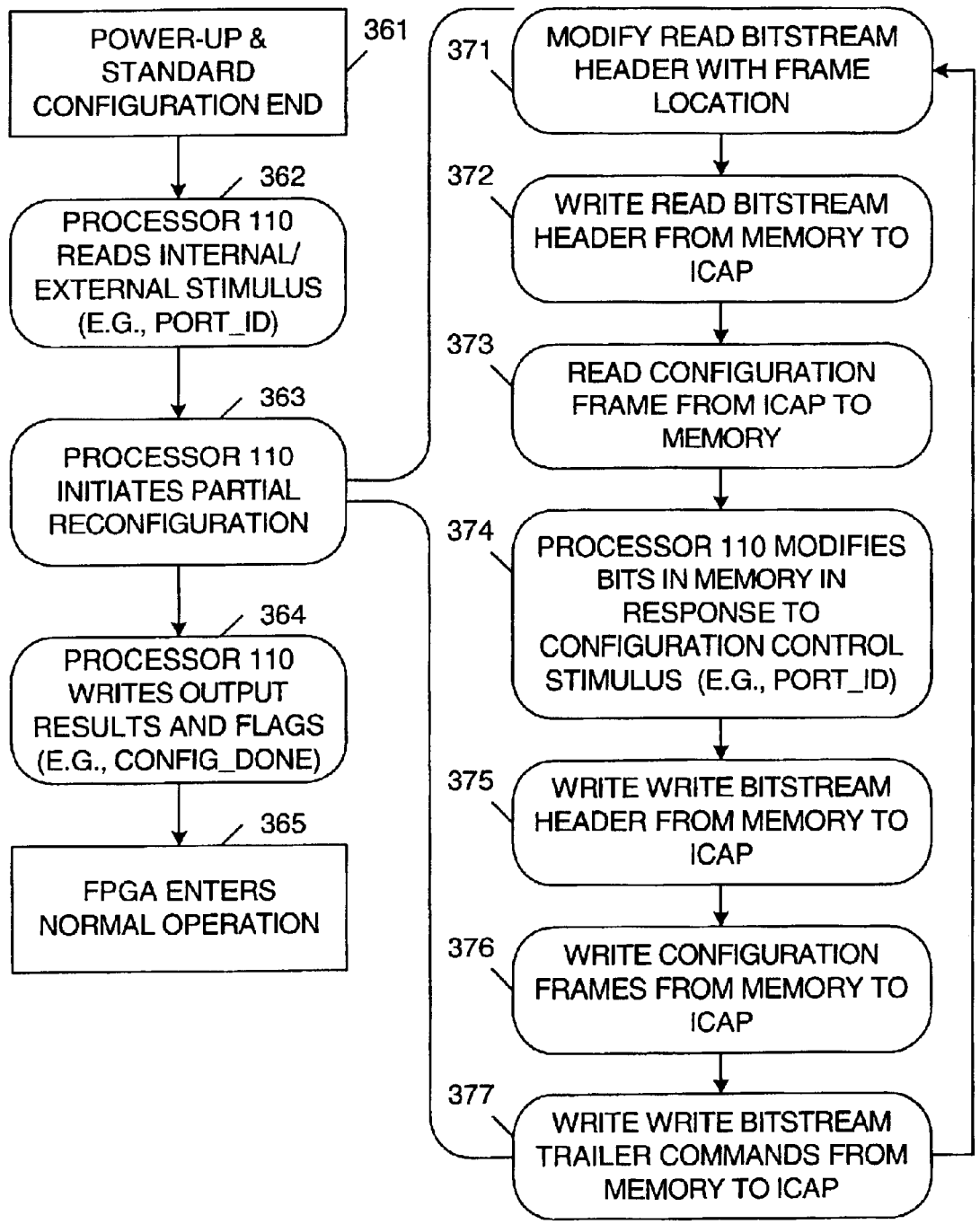
FIG. 10 is a flow diagram of the operation of the architecture in FIG. 8, in accordance with one embodiment of the present invention.

FIG. 10 is a flow diagram of the operation of the architecture in FIG. 8, in accordance with one embodiment of the present invention. Initially, FPGA 90 is powered-up, and a standard configuration is performed by loading a base set of configuration data values in a manner that is known in the art (Step 361). The port identification value (PORT_ID) is loaded into the PORT_ID field of device control register 204. Processor 110 reads the PORT_ID from device control register 204 (Step 362). In response to the PORT_ID value read from device control register 204, processor 110 initiates the partial reconfiguration of the configuration memory array (Step 363). This partial reconfiguration is accomplished as follows (sub-steps 371 to 377).

First, processor 110 modifies a read bitstream header in the DSOCM 354 to identify an address of a frame (e.g., Frame_1) of the configuration memory array (Step 371). Then, processor 110 sets the write enable entry (WR) of device control register 204 to a logic "1" value, clears the done flag (DONE) and the reconfiguration done flag (CONFIG_DONE) in device control register 204, and sets the start and end addresses (START_ADDR and END_ADDR) in device control register 204. The start address (START_ADDR) is set to identify the address in DSOCM 354 where the read-back bitstream header begins, and the end address (END_ADDR) is set to identify the address in DSOCM 354 where the read bitstream header ends. Upon detecting the logic "1" write enable entry (WR) in device control register 204, DMA engine 203 routes the read-back bitstream header stored in DSOCM 354 to ICAP 120 (Step 372). DMA engine 203 then sets the DONE flag to a logic "1" state.

ICAP 120 initiates a configuration frame read operation in response to the received read bitstream header commands. As a result, a frame that includes the configuration data values is retrieved from the configuration memory array, and provided to ICAP 120.

In response to the logic "1" DONE flag, processor 110 resets the write enable entry (WR) to a logic low value, sets the read-back entry (RB) to a logic "1" value, resets the instruction done flag (DONE) to a logic "0" value, and sets the start and end addresses (START_ADDR and END_ADDR) in device control register 204. The start address and the end address (START_ADDR and END_ADDR) identify a block in DSOCM 354 where the retrieved frame is to be written. Upon detecting the logic "1" read-back entry (RB) in device control register 204, DMA engine 203 routes the retrieved frame from ICAP 120 to the location in DSOCM 354 defined by START_ADDR and END_ADDR (Step 373). DMA engine 203 then sets the DONE flag to a logic "1" value.

Upon detecting the logic "1" DONE flag, processor 110 modifies select configuration bits stored DSOCM 354, by overwriting these configuration bits with new configuration bits. These new configuration bits are selected by processor 110 in response to the PORT_ID value retrieved from device control register 204 (Step 374).

Processor 110 then resets the DONE flag to a logic "0" value, resets the read-back entry (RB) to a logic "0" value, and sets the write enable entry (WR) to a logic "1" value in device control register 204. Processor 110 also sets the start and end addresses (START_ADDR and END_ADDR) in device control register 204. The start address (START_ADDR) is set to identify the address DSOCM 354 where the write bitstream header begins, and the end address (END_ADDR) is set to identify the address DSOCM 354 where the write bitstream header ends. Upon detecting the logic "1" write enable entry (WR) in device control register 204, DMA engine 203 routes the write bitstream header stored in DSOCM 354 to ICAP 120, thereby initiating a write access to the configuration memory array (Step 375). DMA engine 203 then sets the DONE flag to a logic "1" state.

Upon detecting the logic "1" DONE flag, processor 110 resets the DONE flag to a logic "0" state, sets the write enable signal (WR) to a logic "1" value, and sets the start and end addresses (START_ADDR and END_ADDR) in device control register 204. The start address (START_ADDR) is set to identify the address in DSOCM 354 where the modified frame begins, and the end address (END_ADDR) is set to identify the address in DSOCM 354 where the modified frame ends. Upon detecting the logic "1" write enable entry (WR) in DCR 204, DMA engine 203 routes the modified frame stored in DSOCM 354 to ICAP 120. In response ICAP 120 writes the modified frame of configuration data values back to the configuration memory array, such that this modified frame of configuration data values overwrites the previously retrieved frame of configuration data values (Step 376). DMA engine 203 then sets the DONE flag to a logic "1" value.

Upon detecting the logic "1" DONE flag, processor 110 resets the DONE flag to a logic "0" state, sets the write enable signal (WR) to a logic "1" value, and sets the start and end addresses (START_ADDR and END_ADDR) in DCR 204. The start address (START_ADDR) is set to identify the address in DSOCM 354 where the write bitstream trailer begins, and the end address (END_ADDR) is set to identify the address in DSOCM 354 where the write bitstream trailer ends. Upon detecting the logic "1" write enable entry (WR) in DCR 204, DMA engine 203 transfers the write bitstream trailer stored in DSOCM 354 to ICAP 120, thereby instructing ICAP 120 to complete the write access to the configuration memory array (Step 377). DMA engine 203 then sets the DONE flag to a logic "1" value, and processing returns to Step 363. Sub-steps 371–377 are then repeated until all of the one or more frames storing configuration data values that are to modified, have been read, modified and written in the foregoing manner. At step 364 processor 110 sets the reconfiguration done flag (CONFIG_DONE) in device control register 204 to a logic "1" value, thereby indicating that the one or more frames have been properly reconfigured. FPGA 90 then begins normal operation (Step 365).

Figure 11:
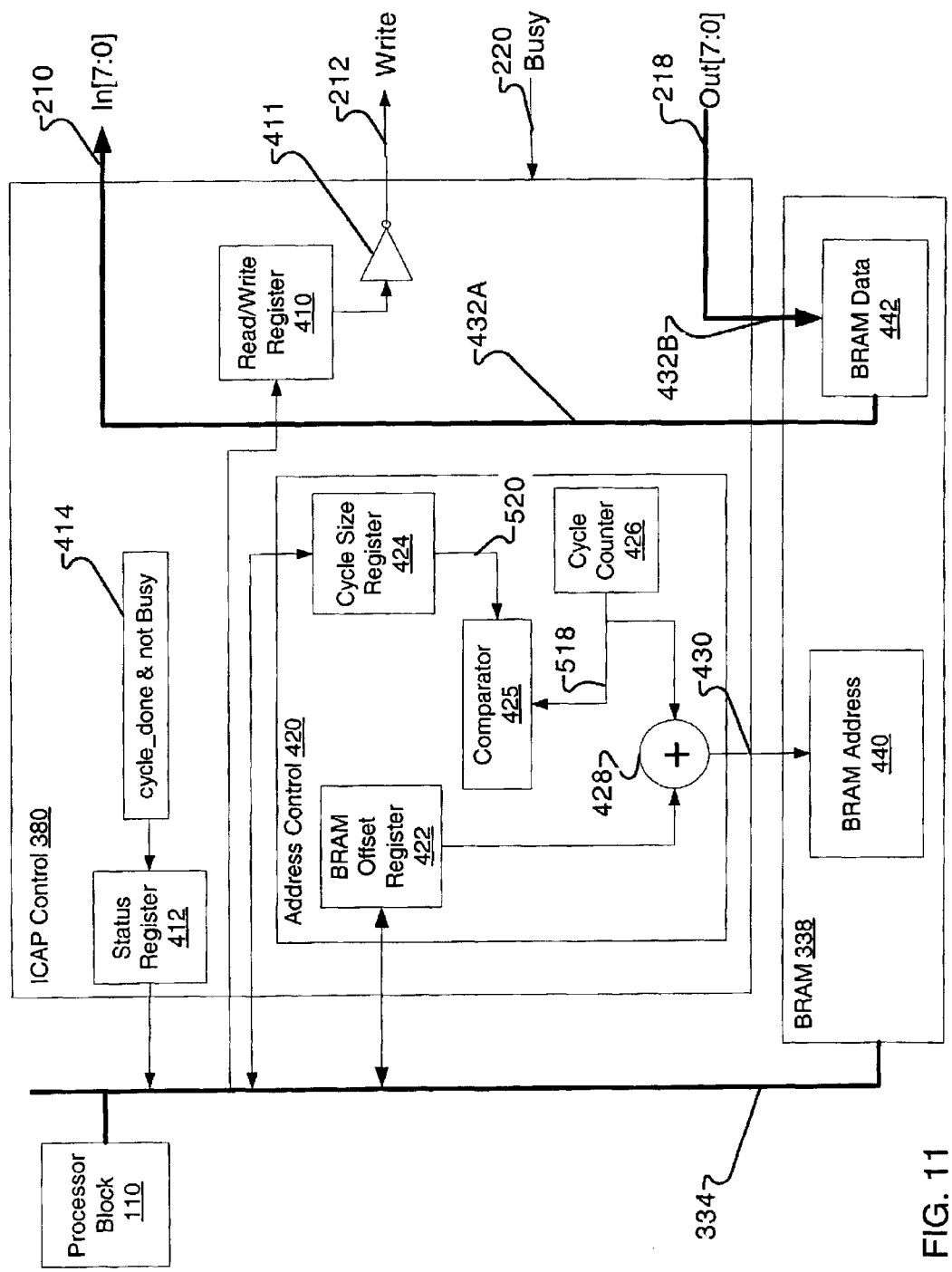
FIG. 11 is a schematic of the ICAP control module of a preferred embodiment of the present invention.

FIG. 11 is a schematic of the ICAP control module of a preferred embodiment of the present invention. The ICAP control module 380 is an example of the ICAP control module 350 of FIG. 7. The bi-directional data bus 336 in FIG. 7 represents uni-directional data buses 432A and 432B. The ICAP control module 380 serves as a pass through for the data buses 432A and 432B, i.e., the ICAP data buses 210 and 218 are directly connected to BRAM data 442 via buses 432A and 432B, respectively. ICAP control module 380 includes a status register 412, an address control module 420, and a read/write register 410. The read/write register 410 is a one bit wide register that is written to by the processor block 110. When the read/write register 410 is written to it initiates a read/write transfer by asserting the start_transfer signal 534 in FIG. 14. The read/write bit is set to 1 for a read from the ICAP 120 and a 0 for a write to the ICAP 120. The read/write register 410 is connected to an inverter 411 which sends the write signal 212 to the ICAP 120 (FIG. 3). The status register 412 is a one bit wide register, which when set to 1 by the logic function 414 (cycle_done 526) AND (NOT (Busy 220))), indicates to the processor block 110 that the read/write transfer for the cycle is complete. After the processor block 110 reads the status register 412, it is reset to 0.

The address control module 420 includes a BRAM offset register 422, a cycle size register 424, a comparator 425, a cycle counter 426, and an adder 428. The address control module 420 generates the memory addresses (BRAM Address 440) for the BRAM data 442 that is being read from and written to by the ICAP 120. The memory addresses are sent to BRAM 338 via a bus 430. The generation is done by adding via adder 428, the starting or base address given in the BRAM offset register 422 to the current integer count (i.e., index for the array) of the cycle counter 426. The cycle counter 426 counts up to the value given in the cycle size register 424 which has the number of (bytes—1) to be read/write per cycle. The comparator 425 compares the current cycle_count 518 from the cycle counter 426 to the cycle_size 520 from the cycle size register 424. Both the BRAM offset register 422 and the cycle_size register 424 can be written to and read from the processor block 110 via bus 334.

Figure 12:
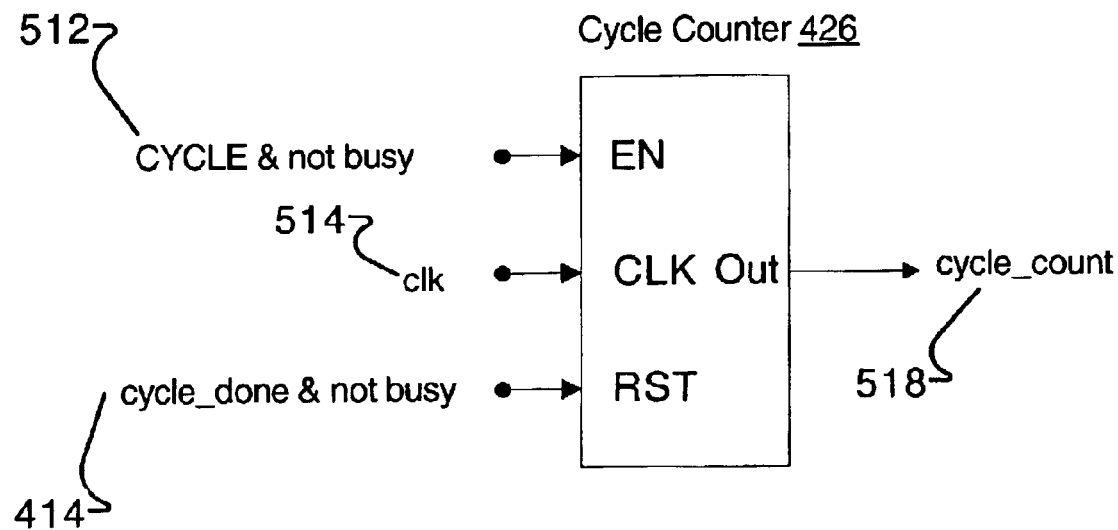
FIG. 12 shows the control signals for the cycle counter of an aspect of the present invention.

FIG. 12 shows the control signals for the cycle counter 426 of an aspect of the present invention. Cycle counter 426 has input signals including an enable signal EN, a clock signal CLK, and a reset signal RST and an output signal OUT that gives the cycle count, i.e., cycle_count 518. The cycle_count 518 is an integer index number that starts at 0 and is incremented by one every clock cycle (clk 514) until there is a reset. The cycle counter 426 is reset (the count is set back to zero), when (cycle_done AND NOT Busy) 512 is asserted, where cycle_done 526 is from the comparator 425 (see FIG. 13) and where busy is the Busy signal 220 from the ICAP 120. The enable signal receives (CYCLE AND NOT Busy) 512, where CYCLE is 1, when the state machine of FIG. 14 is in the cycle state 532, and where busy is the Busy signal 220 from the ICAP 120. The cycle counter 426 hence outputs a new cycle count value when the ICAP Control module 380 is in the cycle state 532 and the ICAP 120 is available (i.e., not busy).

Figure 13:
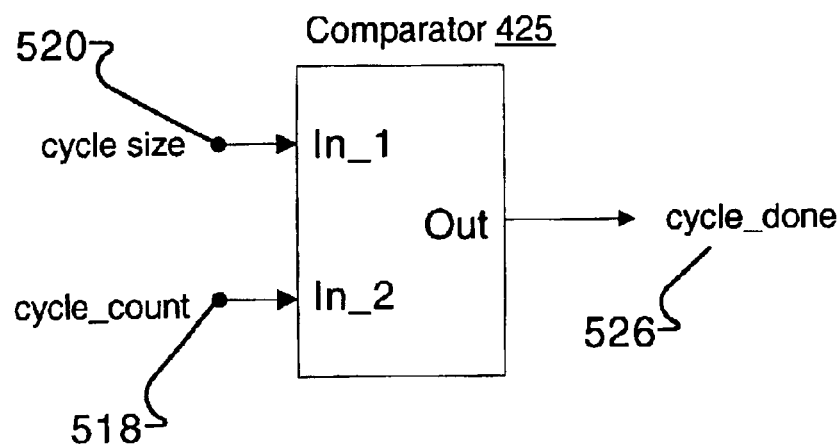
FIG. 13 shows the input and output signals for the comparator of an aspect of the present invention.
Figure 14:
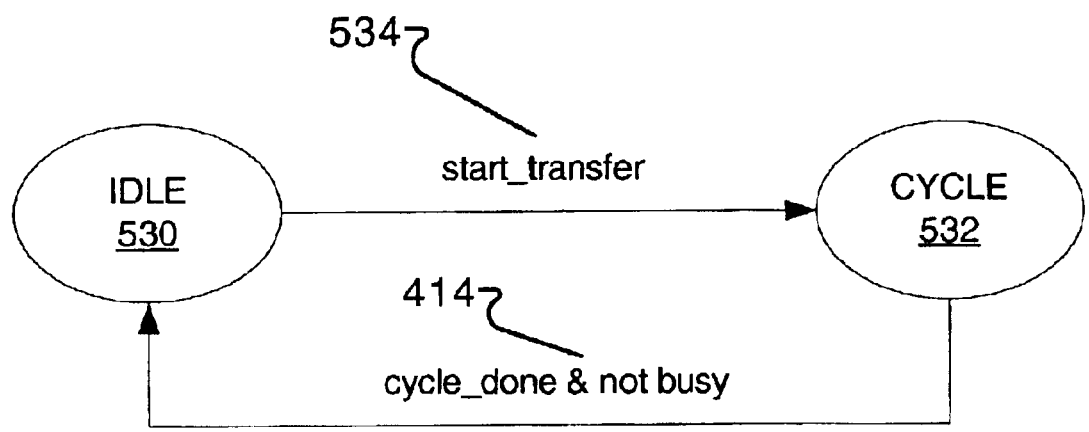
FIG. 14 shows the finite state machine (FSM) for controlling the reads and writes by the ICAP Control.

FIG. 13 shows the input and output signals for the comparator of an aspect of the present invention. The comparator 425 receives the cycle size 520 from cycle size register 424 as a first input IN_1 and the cycle_count 518 from the cycle counter 426 (FIG. 12) as a second input In_2. The comparator 425 compares the input signal i.e. cycle size minus cycle count, and outputs a one, i.e. cycle_done 526 equals 1, when the difference is 0.

FIG. 14 shows the finite state machine (FSM) for controlling the reads and writes by the ICAP Control 380. The FSM includes an IDLE state 530 in which the cycle counter 426 is in its reset state, and a CYCLE state 532 in which data is transferred between the ICAP 120 and the BRAM 338 starting at the address given by address control module 420. The number of bytes transferred in this CYCLE state is cycle_size 520 minus 1.

The FSM begins in the IDLE state 530 and changes to the CYCLE state 532 when there is a start_transfer signal 534 which is asserted when there is a write to the read/write register 410 by the processor block 110. When the (cycle_done AND not Busy) signal 414 is asserted, i.e., the transfer of data is complete, the FSM goes back to the IDLE state 530 from the CYCLE state 532.

Figure 15:
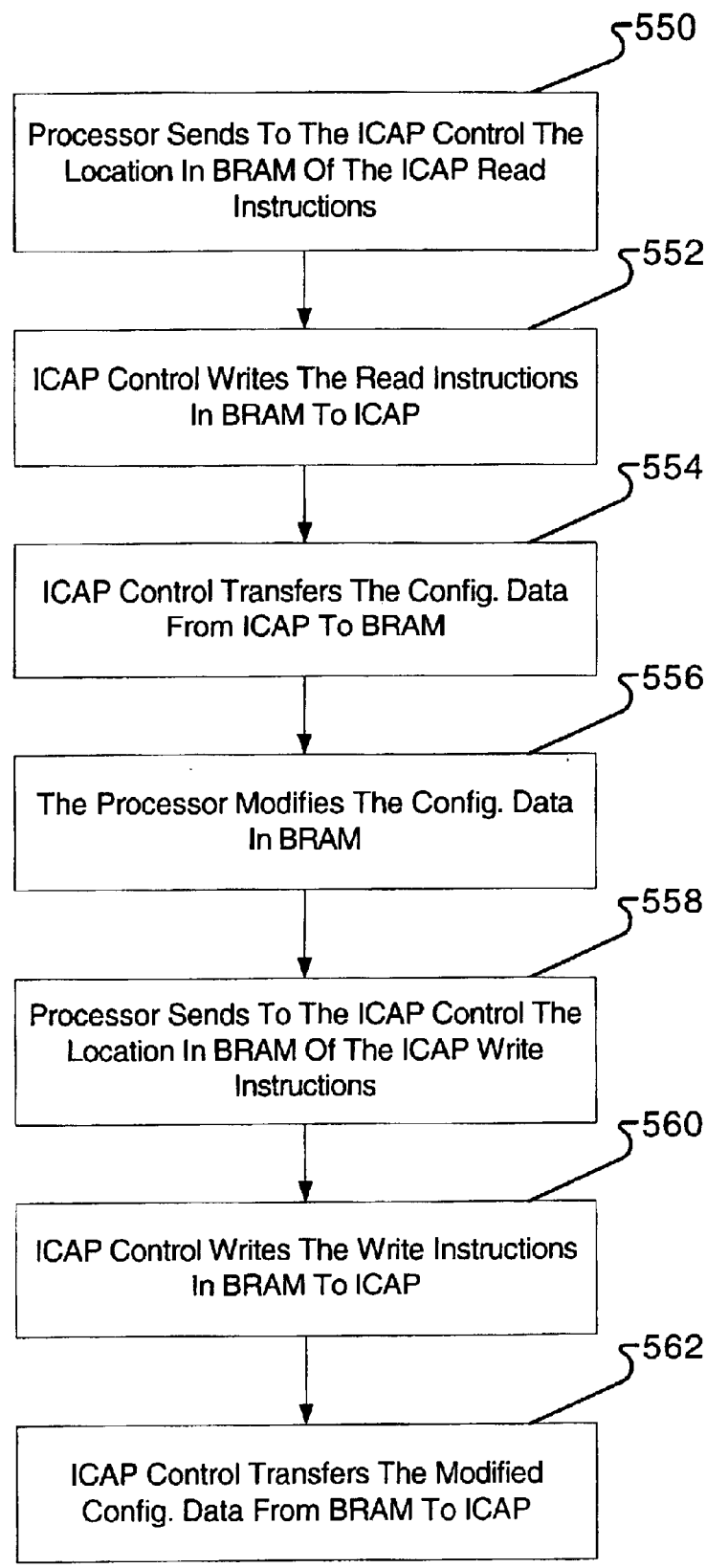
FIG. 15 is a flowchart for the ICAP control writing configuration memory array data from the BRAM to the ICAP of an aspect of the present invention.

FIG. 15 is a flowchart for the ICAP control 380 writing configuration memory array data from the BRAM 338 to the ICAP 120 of an aspect of the present invention. At step 550 processor block 110 sends to the BRAM offset register 422 the starting address in BRAM 388 of the ICAP read instructions to set-up the configuration logic 112 to send the configuration memory array data for one or more frames. At step 552 ICAP control 380 writes the read instructions in BRAM 338 to ICAP 120 (read/write register 410 is set to zero). At step 554, at initiation of processor block 110, i.e., processor block 110 sets read/write register 410 to one, and ICAP Control 380 transfers the one or more frames from ICAP Output 218 to BRAM data 442 via bus 432B. Processor block 110 modifies the one or more frames in BRAM data 442 (step 556). At step 558 the processor block 110 sends to the address control module 420 of ICAP Control 380, the location in BRAM 338 of the write instructions to set-up the configuration logic 112 via ICAP 120 to receive the modified the one or more frames. Upon the initiation of processor block 110 (the read/write register 410 is set to zero), the ICAP Control 380 writes the write instructions in BRAM to ICAP 120 (step 560). After the ICAP write instructions are sent, the ICAP Control 380 continues to write the modified configuration data from BRAM data 442 to ICAP Input 210 via bus 432A (step 562).

In FIG. 15 the arrangement of the BRAM 338 was that there was a first area in BRAM 338 where the ICAP read instructions were stored followed by a reserved space where the one or more frames read from the configuration memory array were to be stored. There was a second area for the ICAP write instructions followed by the modified one or more frames to be written back to the configuration memory array. In addition there was a third area in BRAM 338 storing the computer program that the processor block 110 executes. The foregoing BRAM memory arrangements were for illustration purposes only, and one of ordinary skill in the arts will recognize that many different storage locations and arrangements are possible.

As an example implementation for ICAP Control 380 assume that BRAM 338 looks to system bus 334 (and the processor block 110) as a 512×32 bit RAM and to the ICAP Control 380 via buses 430, 432A and 432B, as a 2048×8 bit memory. In other words the BRAM 338 is a dual port RAM. Let all data transfers be 32 bits (words). The BRAM offset register 422 and cycle size register 424 are assumed to be 11 bits wide.

In this example there are nine driver routines which are used by the processor block 110 to read and write both control information and data to and from the ICAP Control 380 and the BRAM 338. The nine driver routines are as follows:

1. void storageBufferWrite(unsigned int addr, unsigned int data), which writes a 32 bit data value from a register in the processor block 110 to a particular address in the BRAM via system bus 334. The address addr refers to a word address (4 consecutive bytes).

2. unsigned int storageBufferRead(unsigned int addr), which reads a 32 bit data value from a particular address in BRAM 338 to a register in the processor block 110 via system bus 334.

3. void setCycleSizeReg(unsigned int size), which sets the value of the cycle size register 424, as the total number of the bytes to be transferred from the BRAM 338 to the ICAP 120 (or ICAP 120 to the BRAM 338) in one cycle. The number is an 11 bit count of bytes (not words) as the BRAM 338 looks to the ICAP control 380 via bus 336 (FIG. 7) as a 2048×8 bit memory.

4. unsigned int getStorageBufferSizeReg( ), which gets the value currently stored in the cycle size register 424, as an 11 bit count of bytes.

5. extern void setOffsetReg(unsigned int offset), which sets the value of the BRAM offset register 422 to the start address (or offset from the base address) of the data to be transferred between the BRAM 338 and the ICAP 120.

6. extern unsigned int getOffsetReg( ), which gets the value currently stored in the offset register 422.

unsigned int setBaseAddr(unsigned int newBaseAddr), which optionally sets the base address of the BRAM.

7. extern unsigned int getStatusReg( ), gets the current status of the data transfer between BRAM and ICAP, i.e., contents of the status register 412. In an alternative embodiment, reading the status register 412 does not clear the register. Rather, it is polled until cycle_done and not busy is asserted, and then after the result is ignored until a new transfer is started.

9. extern void setDirectionReg(unsigned int wrb); sets the direction of the transfer between the BRAM and ICAP, and also initiates the transfer.

The above device drivers can be used to create a routine to read from the device (ICAP 120) to BRAM 338 and to write to the device (ICAP 120) from BRAM 338.

```
Reading From The Device:
int deviceRead(int offset, int numBytes) {
    /* Make sure we aren't trying to read more than we have
    room for. */
    if (numBytes > MAX_BUFFER_BYTES) return
BUFFER_OVERFLOW_ERROR;
    setOffsetReg(offset);
    setCycleSizeReg(numBytes);
    setDirectionReg(DEVICE_READ);
    /* Wait for completion of operation. */
    while (getStatusReg( ) != cycle_done and not busy);
    return 0;
};
    Writing To The Device:
int deviceWrite(int offset, int numBytes) {
    /* Make sure we aren't trying to read more than we have
    room for. */
    if (numBytes > MAX_BUFFER_BYTES) return
BUFFER_OVERFLOW_ERROR;
    setOffsetReg(offset);
    setCycleSizeReg(numBytes);
    setDirectionReg(DEVICE_WRITE);
    /* Wait for completion of operation. */
    while (getStatusReg( ) != cycle_done and not busy);
    return 0;
};
```

The processor block 110 in interfacing with the ICAP control module 380 and BRAM 338 via system bus 334 as configuration data is read from the ICAP 120 to BRAM 338, modified by processor block 110, and written from BRAM 338 to ICAP 120, executes some of the above functions. In the case of FIG. 15, in steps 550 and 552 deviceWrite( ) causes the ICAP read instructions to be written from BRAM 338 to the configuration logic 112 (see FIG. 7). In step 554 the processor executes a deviceRead( ) which causes, for example, a frame of configuration memory array information to be transferred from the configuration logic 112 to BRAM 338 via ICAP 120, ICAP control 350, and bus 336.

At step 556 the processor block 110 retrieves a selected word from the frame from BRAM using a storageBufferRead( ), modifies the word and writes it back to the BRAM 338 when a storageBufferWrite( ) is executed. The processor repeats the above process in order to modify some or all the words in the frame. At steps 558, 560, and 562 a deviceWrite( ) transfers the ICAP write instructions followed by the modified frame data from BRAM 338 to the configuration logic 112 via bus 336.

Figure 16:
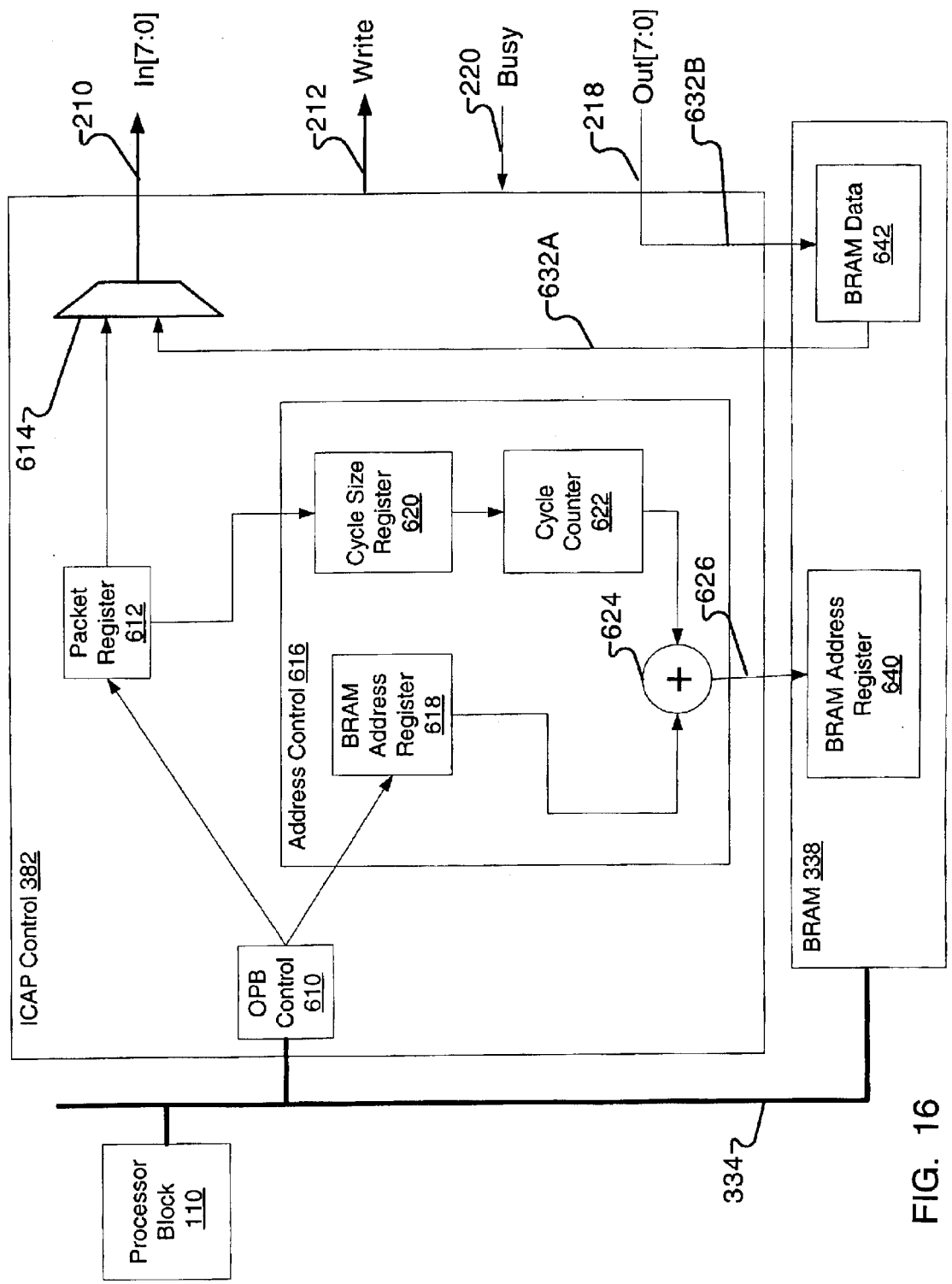
FIG. 16 is a schematic of the ICAP control module of an alternative embodiment of the present invention.

FIG. 16 is a schematic of the ICAP control module of an alternative embodiment of the present invention. The ICAP control module 382 is another example of the ICAP control module 350 of FIG. 7. The bi-directional data bus 336 in FIG. 7 represents uni-directional data buses 632A and 632B in FIG. 16. The ICAP control module 330 serves as a pass through for the data buses 432A and 432B, i.e., the ICAP data bus 210 is connected to BRAM 338 via bus 632A and multiplexer 614 and the ICAP data bus 218 is directly connected to BRAM 338 via bus 632B. ICAP control module 382 includes a On-chip Peripheral Bus (OPB) Controller 610, a packet register 612, an address control module 616, and a multiplexer 614. The processor block 110 sends an ICAP data packet 310 (FIG. 3) to packet register 612. In addition the processor block 110 also sends the starting address in BRAM 338 to read/write the data from/to the ICAP 120. The OPB controller 610 insures the information from the processor block 110 goes to the right register (packet register 612 or BRAM address register 618).

The address control module 616 includes a BRAM address register 618, a cycle size register 620, a cycle counter 622, and an adder 624. The address control module 616 generates the memory addresses (BRAM Address 640) for the BRAM data 642 that is being read from and written to by the ICAP 120. The memory addresses are sent to BRAM 338 via a bus 626. The generation is done by adding via adder 624, the starting or base address given in the BRAM address register 618 to the current integer count (i.e., index for the array) of the cycle counter 622. The cycle counter 622 counts up to the value given in the cycle size register 620 which has the number of (bytes—1) to be read/write per cycle. The cycle size register 620 gets the total count from the word count 320 in ICAP data packet 310 (FIG. 3) stored in packet register 612.

An example of the steps to performing a read/write operation is as follows:

1. Setup the BRAM address register 618 to address BRAM_ADDRESS (e.g. 0).
2. Write an ICAP read command packet to the packet register 612 (e.g., to read a LUT frame).
3. Determine by the ICAP Control 382 the count of bytes from the ICAP read command packet "word" count 320 and write the contents of the packet register 612 to the ICAP port 120. Next the ICAP control 382 reads COUNT bytes of data from the ICAP port 120 and writes the bytes to the BRAM data 642 starting at BRAM_ADDRESS.
4. Perform modifications by the processor block 110 via bus 334 on the LUT frame in BRAM 338. The ICAP control 383 is idle here.
5. Setup the BRAM address register 618 to address BRAM_ADDRESS (e.g., this is the BRAM_ADDRESS in step 1 plus one pad frame to account for the different formats of write and read data).
6. Write an ICAP write command packet to write a frame of data (e.g. the modified LUT frame stored in BRAM).
7. Write the contents of the packet register 612 to the ICAP port 120 followed by a write of COUNT bytes of data from the BRAM 338, starting at BRAM_ADDRESS, to the ICAP 120. COUNT is extracted from the packet register 612 "word" count 320 as in step 3.

Figure 17:
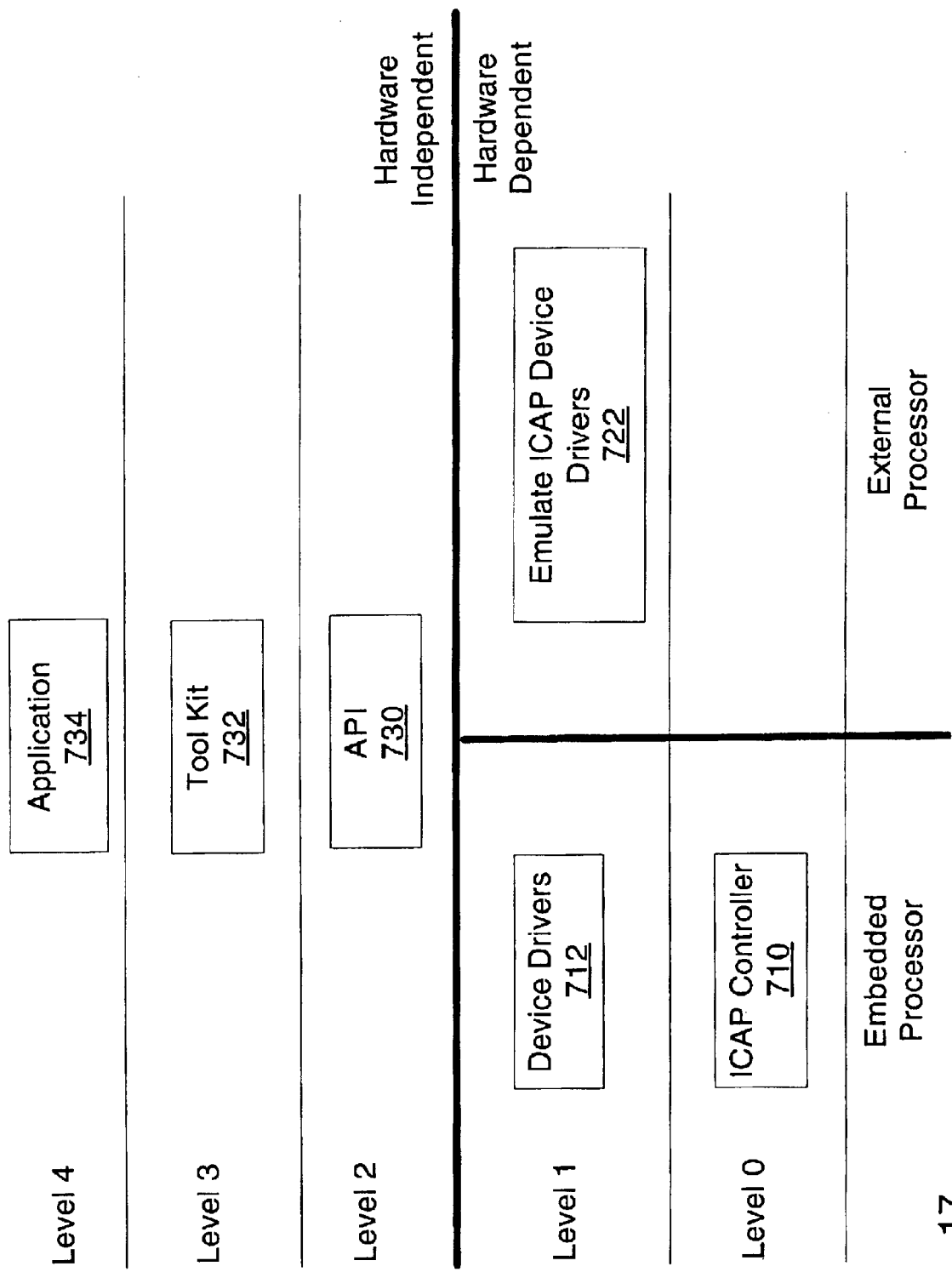
FIG. 17 is a layered architecture of an aspect of the present invention

FIG. 17 is a layered architecture of an aspect of the present invention. The layered approach is used so that an element at one layer or level can be changed without affecting the other levels. In FIG. 17 levels 0 and 1 are hardware dependent and levels 2, 3 and 4 are hardware independent. For an processor such as processor block 110, embodiments of the ICAP controller have been given in FIGS. 6, 8, 11, and 16. Examples of device drivers 712 include setCycleSizeReg( ), getStorageBufferSizeReg( ), setOffsetReg( ) getOffsetReg( ), setBaseAddr( ), getStatusReg( ), and setDirectionReg( ). For the case of an external processor that uses the configuration interface 114 to access the configuration memory array at level 1 the ICAP device drivers 722 are emulated. Level 2 has an Application Program Interface (API) 730, which has routines given in Table 1 below.

TABLE 1

| Routines | Description |
| --- | --- |
| storageBufferWrite( ) | Writes data to the BRAM 338 |
| storageBufferRead( ) | Reads data from BRAM 338 |
| deviceWrite( ) | Writes specified number of bytes from BRAM 338 to ICAP 120 |
| deviceRead( ) | Reads specified number of bytes from ICAP 120 to BRAM 338 |
| deviceAbort( ) | Aborts the current operation |
| deviceReadFrame( ) | Reads one frame from ICAP 120 into the BRAM 338 |
| deviceReadFrames( ) | Reads multiple frames from ICAP 120 into the BRAM 338 |
| deviceWriteFrame( ) | Writes one frame to ICAP 120 from the BRAM 338 |
| deviceWriteFrames( ) | Writes multiple frames to ICAP 120 from the BRAM 338 |
| setConfiguration( ) | Loads a configuration from a specified memory location |
| getConfiguration( ) | Writes current configuration to a specified memory location |

The routines in API 730 are also layered and the layers for Table 1 are given in Table 2 below. The layered approach allows the replacement of lower layers with faster hardware implementations without making changes to the higher layers.

TABLE 2

| Layers | Routines in Layer |
| --- | --- |
| Layer 0 | storageBufferWrite( ), storageBufferRead( ), deviceWrite( ), deviceRead( ), deviceAbort( ) |
| Layer 1 | deviceReadFrame( ), deviceWriteFrame( ) |
| Layer 2 | deviceReadFrames( ), deviceWriteFrames( ) |
| Layer 3 | setConfiguration( ), getConfiguration( ) |

A toolkit 732 providing routines to the application 734 for dynamic resource modification, i.e., resource modification on the fly, including relocatable modules. Like the routines in Table 2 above, these routine may be readily incorporated by a user in application programs written in high level languages such as C, C++, C#, VB/VBA, and the like. Examples of such level 3 routines are given in Table 3 below.

TABLE 3

| Routines | Description |
| --- | --- |
| setLUT( ) | Sets the value of a LUT on the FPGA |
| getLUT( ) | Gets the value of a LUT on the FPGA |
| getFF( ) | Gets the value of a FF on the FPGA |
| setCLBBits( ) | Sets the value of a selected CLB resource on the FPGA |
| getCLBBits( ) | Gets the value of a selected CLB resource on the FPGA |
| setModule( ) | Place the module at a particular location on the FPGA |
| copyModule( ) | Given a bounding box copy the module is copied to a new location on the FPGA | where LUT is a Look-up table and FF is a flip-flop.

The setLUT( ) command, for example, includes the following steps:
1. Determine the target frame
2. Find LUT bits in the target frame
3. Read the target frame from the ICAP and store in BRAM using deviceReadFrame( )
4. Modify the LUT bits in BRAM using writeStorageBuffer( )
5. Reconfigure the FPGA with the modified LUT bits using deviceWriteFrame( )

Figure 4:
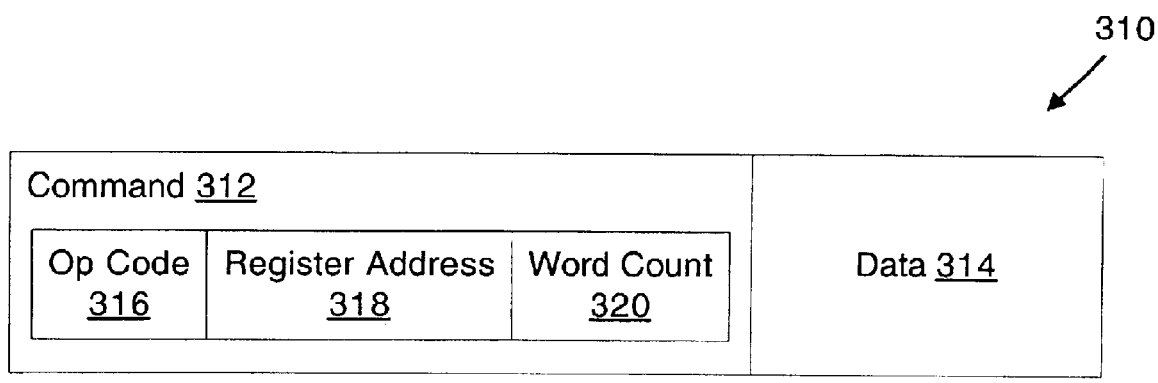
FIG. 4 is a simplified format of a data packet sent to the input bus of the ICAP module of FIG. 3.

The toolkit 732 provides two functions for dealing with relocatable modules:

int setModule(char*data, int fromY1, int toY1);
int copyModule(char*data, int fromX1, int fromY1, int fromX2, int fromY2, int toX1, int toY1);

The setModule( ) function moves the bits in a region of the configuration memory array from one location to another. The setModule( ) works on a partial bitstream that contains information about all of the rows in the included frames. It works by modifying the register address 318 (FIG. 4) located in the command portion 312 of the configuration data packet 310.

Figure 18:
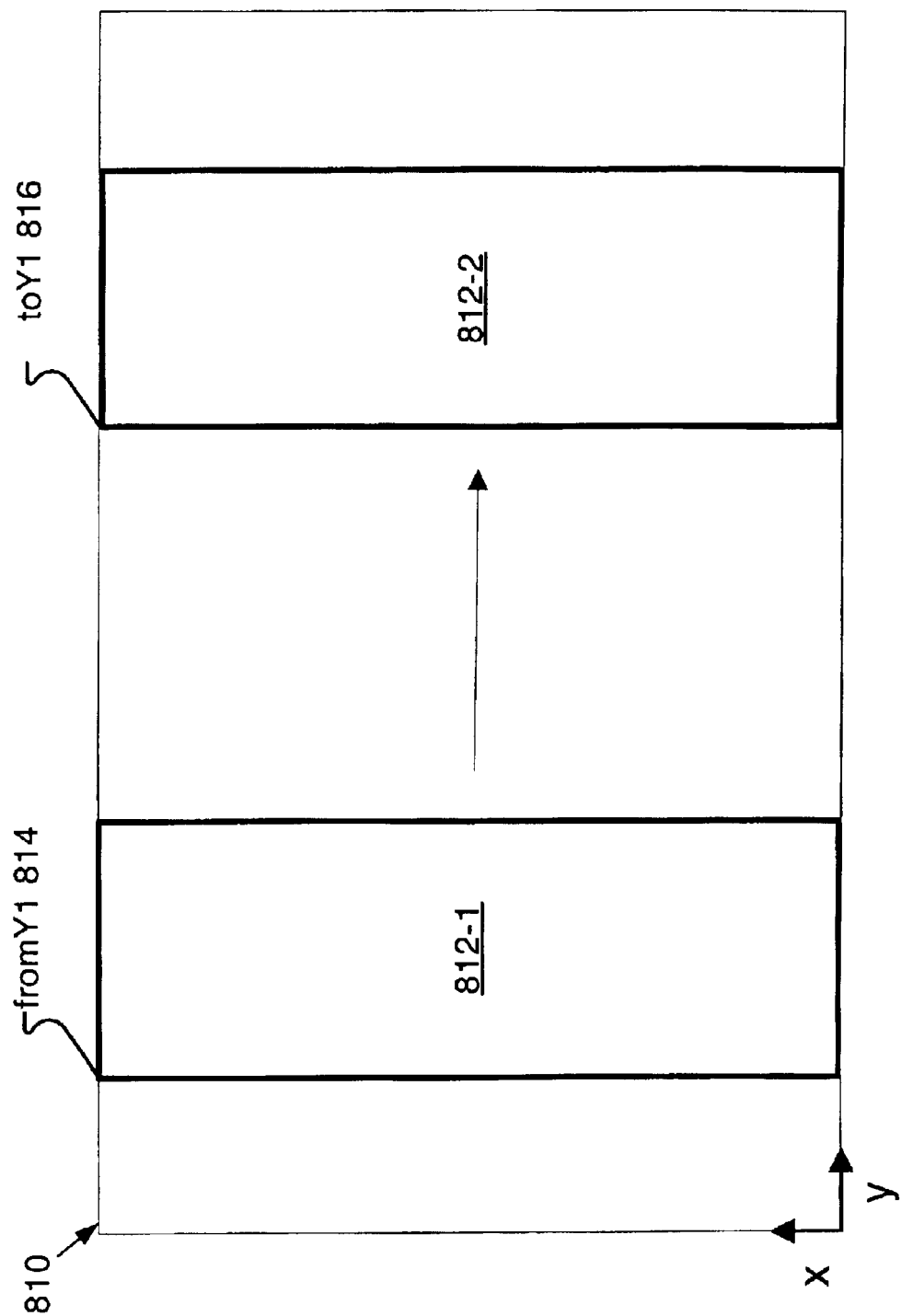
FIG. 18 shows an example of a module being moved from an old location to a new location on the configuration memory array by the setModule( ) function.

FIG. 18 shows an example of a module being moved from an old location 812-1 to a new location 812-2 on the configuration memory array (FIGS. 2-1 and 2-2) by the setModule( ) function. The module has N frames located at location 812-1 with a corner point of fromY1 814, where N is a positive number. These N frames are then relocated to location 812-2 with corner point toY1 816.

The copyModule( ) function copies any sized rectangular region of the configuration memory array and writes it to another location. The copied region contains just a subset of the rows in a frame. This allows the creation of dynamic regions that have static regions above and/or below it. The copyModule( ) function employs a read/modify/write strategy like the resource modification functions. This technique works well for changing select bits in a frame and leaving the others bits in their current configured state.

Figure 19:
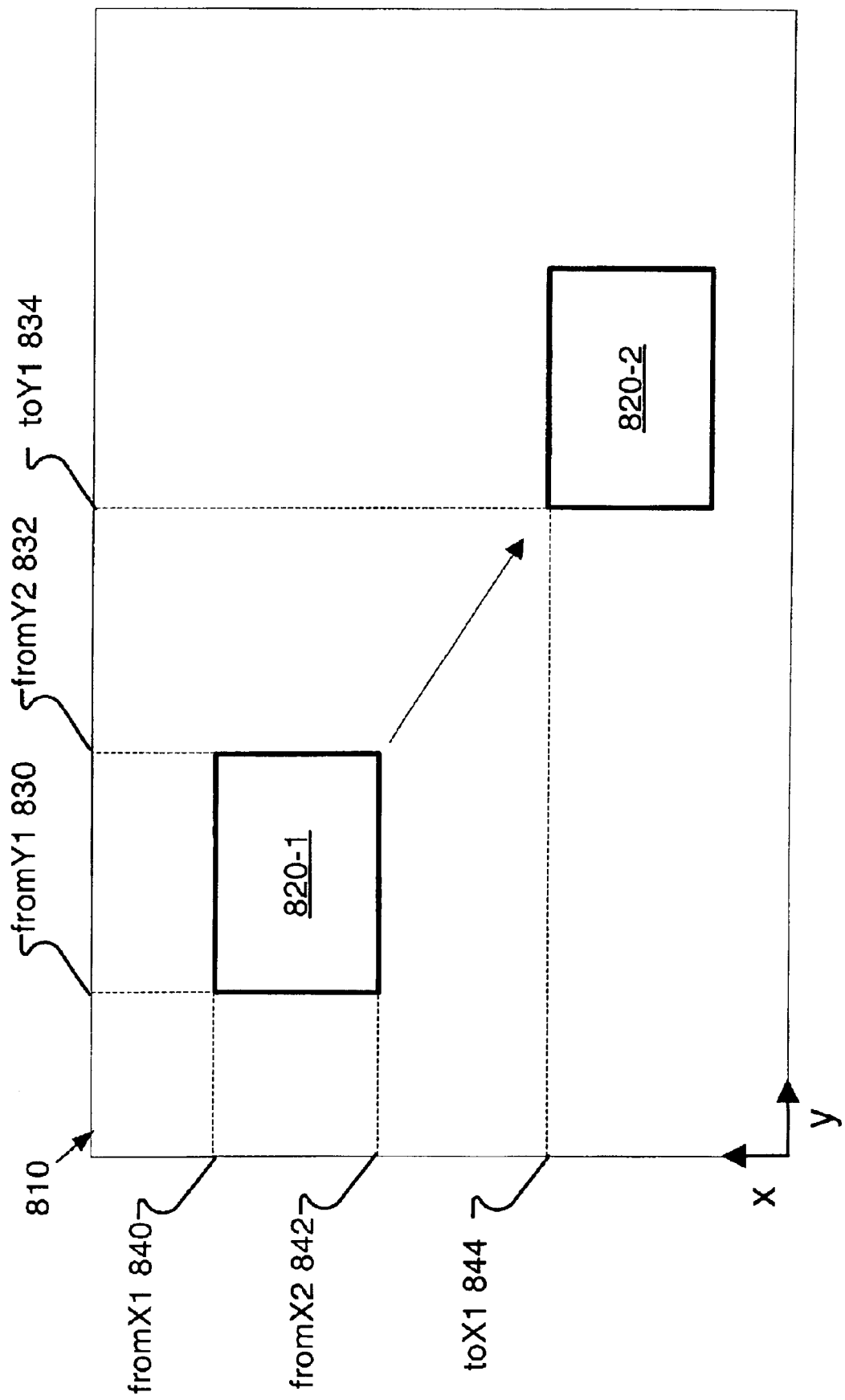
FIG. 19 shows an example of a module being copied from an old location to a new location on the configuration memory array by the copyModule( ) function.

FIG. 19 shows an example of a module being copied from an old location 820-1 to a new location 820-2 on the configuration memory array (FIGS. 2-1 and 2-2) by the copyModule( ) function. The rectangular region 820-1 has y-coordinates fromY1 830 and fromY2 832, which show the location of the original N frames. The X coordinates fromX1 840 and fromX2 842 are the locations of the rows in the original N frames. The top corner coordinate used as a reference for the copied region 820-1 is (toX1 844, toY1 834).

Other functions include setting and retrieving the particular configuration memory array bits for a selected resource such as a CLB, e.g.:

```
int setCLBBits(int row, int col, int resource[ ][2], int
    value[ ], int numBits);
int getCLBBits(int row, int col, int resource[ ][2], int
    value[ ], int numBits);
```

The setCLBBits( ) is a more generalized function than the setLUT( ) function. The setCLBBits( ) can be used to set the value of a LUT instead of setLUT( ). However, in one embodiment the setCLBBits( ) is not as efficient as setLUT( ). This is because setLUT( ) knows that all the bits that control the LUT are located in one frame, so that setLUT( ) can read one frame, modify the M bits (where M is a predetermined integer value), and then writes back the modified frame. On the other hand setCLBBits( ) does a read/modify/write M times, as there is no assumed predetermined location for the frame each bit is in.

The above API and toolkit functions allow for use of high level programming constructs and even a graphical user interface (GUI) for the full or partial reconfiguration of an IC, comprising a plurality of programmable logic modules, such as an FPGA. For example, in FIG. 19 a copy and paste in a PC window could copy the region 820-1 to region 820-2. A GUI such as in Microsoft® Visio® would permit a user-friendly graphical means to relocate regions in an FPGA.

When there is an processor such as a soft core Microblaze™ processor or a hard core PowerPc® processor, then the interface to the configuration memory array is via the ICAP control module and the ICAP 120. If there is an external processor then access to the configuration memory array is via the configuration interface 114, such as the select map interface. The layered architecture of FIG. 17, allows the API 730 and toolkit 732 to be hardware independent. In addition the Application layer 734 is written in a high level language such as C or C++.

In an IC having programmable logic modules, there may be more than one processor. FIGS. 1, 2-1, and 2-2 only show one processor in order not to obscure the invention. However, for example, the Virtex II Pro™ of Xilinx Inc. of San Jose, Calif. has upto four PowerPC®s. Hence embodiments of the present invention are not limited to one processor, but include one or more processors.

In the case of multi-processors that access a shared resource on the IC, an arbitration mechanism, such as a semaphore, is needed to control access to the shared resource, so that only one processor accesses the shared resource at a time. In the specific case of the ICAP 120 of which there is only one, the ICAP 120 is a shared resource to the multiple processors. In one embodiment of the present invention a semaphore is used to control access to the ICAP.

Figure 20:
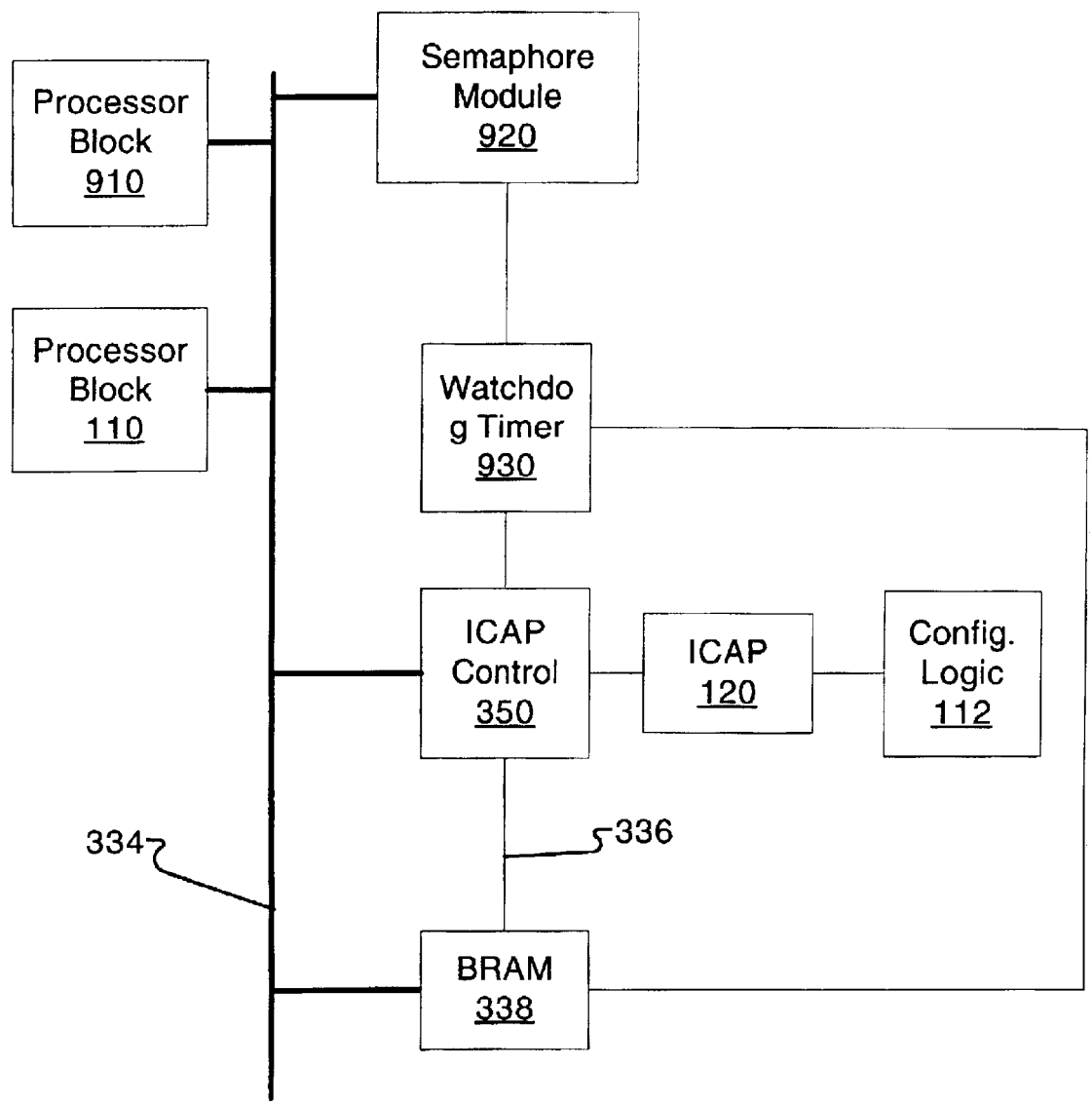
FIG. 20 is a block diagram of a multiprocessor system using a semaphore to control access to a shared resource of an embodiment of the present invention.

FIG. 20 is a block diagram of a multiprocessor system using a semaphore to control access to a shared resource of an embodiment of the present invention. FIG. 20 has some blocks similar to those in FIG. 7 and those blocks are labeled with the same number. FIG. 20 shows two processors, i.e., processor blocks 910 and 110, that are connected via a system bus 334 to BRAM 338, semaphore module 920, and ICAP control 350. The BRAM 338 and ICAP control 350 are shared resources to the multiple processors. To access a shared resource, for example, the ICAP control 350, a processor block, e.g., 110, requests access be granted from semaphore module 920. Typically the processor 110 will poll until access is granted. Once access is granted, i.e. processor 110 has the semaphore, processor block 110 can access ICAP control 350 and read, write, or modify one or more frames from the configuration memory array. Processor 110 is responsible for releasing the semaphore. There is a watchdog timer 930 to prevent a deadlock if semaphore module 920 does not received a release of the semaphore by processor block 110 within a predetermined time. The watchdog timer 930 counts down to zero from a predefined value. On access to ICAP Control 350 the watchdog timer 930 is reset to the predefined value. When the watchdog timer 930 reaches zero the semaphore is automatically released and processor block 110 must request the semaphore again from semaphore module 920 before processor block 110 can have access to ICAP control 350.

Figure 21:
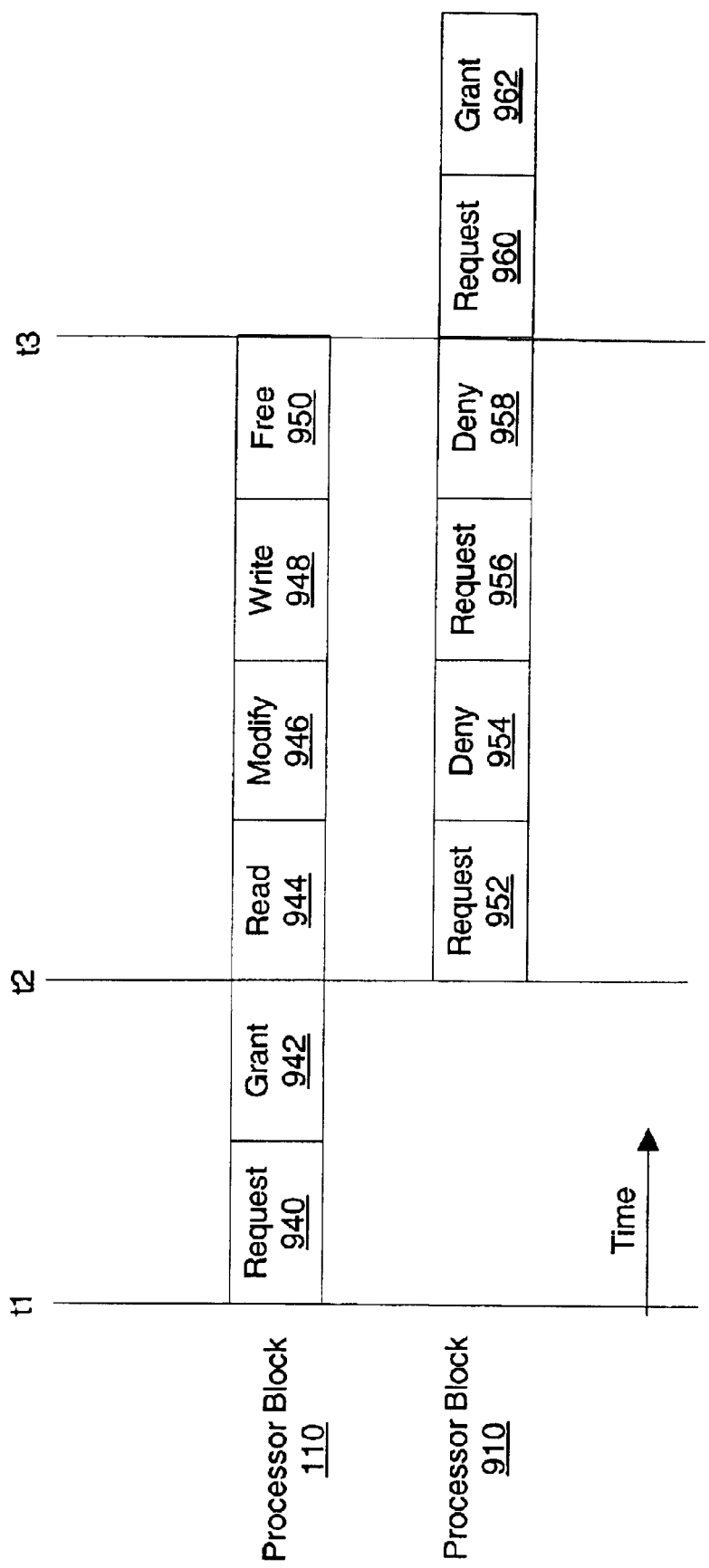
FIG. 21 shows the events vs, time for two processor blocks trying to use a shared resource of an aspect of the present invention.

FIG. 21 shows the events vs. time for two processor blocks trying to use a shared resource, for example, BRAM 338 or ICAP control 350 of an aspect of the present invention. Processor block 110 at time t1 sends request 940 to semaphore module 920 and receives a grant 942 of the semaphore. At time t2 processor block 110 then reads 944 one or more frames from the configuration memory array via ICAP control 350, modifies 946 one or more of the frames, and writes 948 the one or more modified frames back to the configuration memory array via ICAP control 350. Processor block 110 then frees 950 the semaphore in semaphore module 920. Concurrently at time t2, processor block 910 requests 952 from semaphore module 920 the semaphore for access to ICAP control 350. As the semaphore has been granted to processor block 110, the request 952 by processor block 910 is denied 954. Processor block 910 polls semaphore module 920 (request 956, deny 958) until the semaphore is free 950. At time t3 processor block 910 in response to its request 960 for the semaphore is then granted 962 by semaphore module 920. While the examples given above for the shared resource were the BRAM 338 and ICAP control 350, the use of the semaphore as described can be applied to any shared resource.

Although the above functionality has generally been described in terms of specific hardware and software, it would be recognized that the invention has a much broader range of applicability. For example, the software functionality can be further combined or even separated. Similarly, the hardware functionality can be further combined, or even separated. The software functionality can be implemented in terms of hardware or a combination of hardware and software. Similarly, the hardware functionality can be implemented in software or a combination of hardware and software.

Although the invention has been described in connection with several embodiments, it is understood that this invention is not limited to the embodiments disclosed, but is capable of various modifications, which would be apparent to one of ordinary skill in the art. For example, although only one processor is shown on FPGA 100, it is understood that more than one processor may be present in other embodiments. Thus, the invention is limited only by the following claims.

We claim:

1. A method for reconfiguring an integrated circuit, comprising a plurality of programmable logic modules, a processor, a memory array having configuration information for the plurality of programmable logic modules, and a memory module, the method comprising:

reading a section of the configuration information from the memory array;

storing the section in the memory module;

the processor modifying at least some of the section; and writing the modified section of the configuration information to the memory array; and wherein the at least same of the section is modified by the processor without communicating configuration data through an external interface circuit.

2. The method of claim 1 wherein the processor comprises at least one of the plurality of programmable logic modules that is not being reconfigured.

3. The method of claim 1 wherein the processor comprises a hardware microprocessor.

4. The method of claim 1 wherein the programmable logic module comprises a configurable logic block (CLB).

5. The method of claim 1 wherein the memory module comprises a block random access memory (BRAM).

6. The method of claim 1 wherein the integrated circuit comprises a field programmable gate array having a processor.

7. A method for reconfiguring a programmable logic device, comprising a plurality of programmable components, a configuration memory array, a processor, and a plurality of block memory modules, the method comprising:

reading configuration data for a programmable component of the plurality of programmable components from the configuration memory array;

storing the configuration data in a block memory module of the plurality of block memory modules;

the processor partially modifying the stored configuration data without using an input/outout block or JTAG port; and writing back the partially modified configuration data to the configuration memory array.

8. The method of claim 7 wherein the integrated circuit further comprises a internal configuration access port, and wherein access to the configuration memory array is via the internal configuration access port.

9. The method of claim 7 wherein the programmable component is selected from a group consisting of a configurable logic block (CLB), an IO block, a multi-gigabit transceiver (MGT), and block random access memory (BRAM).

10. The method of claim 7 wherein the programmable logic device is a field programmable gate array having a processor.

11. A programmable logic device comprising:

a configuration memory array configured to store frames of configuration data values that define the configuration of the programmable logic device;

means for reading a frame from the configuration memory array;

means for modifying a subset of the configuration data values in the frame without using a means for sending the frame to an external device, thereby creating a modified frame; and means for writing the modified frame to the configuration memory array, thereby partially reconfiguring the programmable logic device.

12. An application programming interface comprising computer routines stored in a computer readable medium for controlling transfer of a frame between a configuration memory array and a random access memory (RAM) of a programmable logic device, the computer routines executed by a processor of the programmable logic device, the computer routines comprising:

a first routine for reading the frame from the configuration memory array to the RAM;

a third routine for sending a bit of the frame modified by the processor to the RAM without using an input/output block (IOB) or JTAG circuit; and a second routine for writing the modified frame from the RAM to the configuration memory array.

13. A computer program stored in a computer readable medium comprising computer code operated on by a processor for a programmable logic device, the computer code comprising:

code for reading a frame from a configuration memory array to a random access memory, wherein the programmable logic device, comprises the configuration memory array and the random access memory;

code for transferring the frame from the random access memory to the processor without using an input/out put block IOB or JTAG circuit; and code for writing a modified frame from the processor to the random access memory, wherein the modified frame comprises the frame modified at least in part by the processor.

14. The computer program of claim 13 wherein the computer code further comprises:

code for setting a value in configuration information associated with a configurable logic block, the configuration information stored in the configuration memory array.

15. The computer program of claim 13 wherein the computer code further comprises:

code for copying at least a portion of the frame from a first part of the configuration memory array to a second part of the configuration memory array.

* * * * *